(12) United States Patent
Shigehara

(10) Patent No.: US 6,194,952 B1
(45) Date of Patent: Feb. 27, 2001

(54) TRANSMISSION GATE CIRCUIT

(75) Inventor: Hiroshi Shigehara, Machida (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/305,282

(22) Filed: May 5, 1999

(30) Foreign Application Priority Data

May 6, 1998 (JP) .................................................. 10-123554

(51) Int. Cl.[7] .................................................... H03K 3/01
(52) U.S. Cl. ........................ 327/534; 327/535; 327/537; 327/436; 327/437
(58) Field of Search .................................. 327/534, 535, 327/537, 391, 207, 208, 209, 210, 433, 434, 436, 437

(56) References Cited

U.S. PATENT DOCUMENTS 4,473,761 * 9/1984 Peterson ................................ 327/437
5,546,020 * 8/1996 Lee et al. ............................... 327/534
5,617,044 4/1997 Takamoto ................................ 327/77
5,689,209 * 11/1997 Williams et al. ..................... 327/534
5,739,702 4/1998 Shigehara et al. ...................... 326/86
5,767,733 * 6/1998 Grugett ................................. 327/534

* cited by examiner

Primary Examiner—Timothy P. Callahan
Assistant Examiner—An T. Luu
(74) Attorney, Agent, or Firm—Oblon, Spivak, McClelland, Maier & Neustadt, P.C.

(57) ABSTRACT

When a power supply terminal (10) is grounded, a circuit (101) is in the OFF state, and a high potential is transferred from a circuit (3) to a bus line (BL), the high potential is transferred to a node (100) via the source of a transistor (P1), back gate (Nw), and transistor (P2). A NAND circuit (NA1) always outputs a control signal (VGP) of a level equal to the node (100) to the gate of the transistor (P1) to turn non-conductive the transistor (P1). Hence, a current path from a terminal (B) to a terminal (A) or from the terminal (B) to the back gate (Nw) is cut off to prevent wasteful current consumption.

22 Claims, 23 Drawing Sheets

TRANSMISSION GATE CIRCUIT

BACKGROUND OF THE INVENTION

The present invention relates to a transmission gate circuit in a semiconductor integrated circuit and, more particularly, to a transmission gate circuit having a function of compensating variations in resistance value by a body effect.

Electronic devices such as a computer and controller incorporate a plurality of circuit boards, which are connected to a common bus line. In this case, each circuit board comprises a transmission gate circuit and is connected to the common bus line via the transmission gate circuit. Each circuit board exchanges signals with the bus line via the transmission gate circuit to transmit/receive signals between circuit boards.

FIG. 21 shows the arrangement of transmission gate circuits 2 and 3 associated with the present invention, that are connected to a bus line BL. The transmission gate circuits 2 and 3 are respectively connected to circuit boards which transmit/receive signals via the transmission gate circuits 2 and 3 and bus line BL.

The back gate of an NMOS transistor is biased to the ground potential, unless otherwise specified.

Both the transmission gate circuits 2 and 3 have a CMOS structure and operate as complementary switches. Thus, the ON resistance can be decreased over the voltage range in use from the ground voltage Vss to the power supply voltage Vcc. The transmission gate circuit 3 is an analog switch having the most basic structure. This analog switch comprises n- and p-channel MOS transistors HN1 and HP1. The analog switch has one terminal connected to an input terminal IN2, and the other terminal connected to an output terminal OUT2. The gate of the transistor HN1 receives a signal generated by inputting an enable signal /EN2 to inverters INV4 and INV3, and the gate of the transistor HP1 receives a signal output from the inverter INV4. Since the input and output terminals IN2 and OUT2 function as input/output terminals, they are used not only when a signal is transferred from a circuit (not shown) to the bus line BL but also when a signal is transferred from the bus line BL to the circuit (not shown). The back gate of the transistor HN1 is grounded, whereas the back gate of the transistor HP1 is connected to the power supply voltage Vcc terminal. When the enable signal /EN2 is at high level, the transmission gate circuit 3 is turned into a conductive state to electrically connect the input and output terminals IN2 and OUT2; when the signal /EN2 is at low level, it changes to a non-conductive state.

The transmission gate circuit 2 comprises a switch SW for switching (between the power supply voltage vcc terminal or ground terminal) and a power supply terminal 10, and is turned on when the power supply terminal 10 is connected to the power supply voltage Vcc terminal. At this time, the power supply voltage Vcc is supplied to inverters INV1 and INV2 and the power-supply-side terminal of a transistor P3. When the power supply terminal 10 is connected to the ground terminal, the circuit 2 does not receive any power supply voltage vcc and is turned off.

The transmission gate circuit 2 comprises a body effect compensation circuit in addition to an analog switch which is made up of p- and n-channel MOS transistors P1 and N1 each having one terminal connected to a terminal A connected to an input terminal IN1, and the other terminal connected to a terminal B connected to an output terminal OUT1 connected to the bus line BL. As a body effect compensation circuit for the p-channel MOS transistor P1, the transmission gate circuit 2 comprises a switch made up of p- and n-channel MOS transistors P1P and N1P, a switch made up of p- and n-channel MOS transistors P2P and N2P, and the transistor P3 used for connection to the power supply terminal 10 in the non-conductive state. The switch made up of the transistors P1P and N1P has one terminal connected to the terminal A and the other terminal connected to a back gate Nw of the transistor P1. The switch made up of the transistors P2P and N2P has one terminal connected to the back gate Nw of the transistor P1 and the other terminal connected to the terminal B. The transistor P3 has one terminal connected to the back gate Nw and the other terminal connected to the power supply terminal 10.

As a body effect compensation circuit for the n-channel MOS transistor N1, the transmission gate circuit 2 comprises a switch made up of n- and p-channel MOS transistors N1N and P1N, a switch made up of n- and p-channel MOS transistors N2N and P2N, and an n-channel MOS transistor N2 used for connection to the ground terminal in the non-conductive state. The switch made up of the transistors P1N and N1N has one terminal connected to the terminal A and the other terminal connected to a back gate Pw of the transistor N1. The switch made up of the transistors P2N and N2N has one terminal connected to the back gate Pw of the transistor N1 and the other terminal connected to the terminal B. The transistor N2 has one terminal connected to the back gate Pw of the transistor N1 and the other terminal grounded.

When the power supply voltage Vcc terminal is connected to the power supply terminal 10 by the switch SW and the transmission gate circuit 2 is in the conductive state, the circuit 2 operates as follows. When an enable signal /EN1 is at high level, a signal EN1 inverted by the inverter INV1 is input to the gates of the transistors P1, P1P, P2P, P1N, and P2N to turn them into the conductive state, and the signal /EN1 is input to the gates of the transistors N1, N1P, N2P, N1N, and N2N to turn them conductive. Then, the terminals A and B are electrically connected, and both the transistors P3 and N2 are turned non-conductive.

Since the transistors P1P, N1P, P2P, and N2P are turned conductive, the source and back gate Nw of the transistor P1 are short-circuited to compensate for the body effect on the transistor P1. Since the transistors P1N, N1N, P2N, and N2N are turned conductive, the source and back gate Pw of the transistor N1 are short-circuited to compensate for the body effect on the transistor N1.

When the enable signal /EN1 is at low level, the transistors P1, P1P, P2P, P1N, P2N, N1P, N2P, N1N, N2N, and N1 are turned non-conductive to change the terminals A and B to a non-conductive state. Further, the transistors P3 and N2 are turned conductive so as not to float the back gates Nw and Pw. The back gate Nw is connected to the power supply voltage Vcc terminal by the transistor P3, and the back gate Pw is grounded by the transistor N2.

In the CMOS structure like the transmission gate circuit 2, parasitic diodes by p-n junctions exist at various portions. FIG. 22 shows the sectional structure of a transistor circuit having a CMOS structure formed on a semiconductor substrate 1. This structure is called a triple-well structure. A deep n-well DNW is formed in the surface of the p-type semiconductor substrate 1, a p-well DPW is formed in the n-well DNW, a p-well PW is formed adjacent to the n-well DNW, and an n-well NW is formed in the p-well PW. N-type diffusion layers ND3 and ND4 are formed in the surface of the deep n-well DNW, and biased to the power supply voltage Vcc by the power supply terminal 10 when the circuit 2 is in the ON state. P-type diffusion layers PD13 and PD14 are formed in the surface of the p-well PW and biased to the ground potential.

An NMOS region where an n-channel MOS transistor having n-type diffusion layers ND1 and ND2, a gate oxide GO1, and a gate electrode G1 is formed exists on the surface of the p-well DPW. In this NMOS region, p-type diffusion layers PD1 and PD2 are further formed as terminals of the back gate Pw of the n-channel MOS transistor, and biased to a predetermined voltage level via a terminal Vdpw when the circuit 2 is in the ON state. A PMOS region where a p-channel MOS transistor having p-type diffusion layers PD1 and PD2, a gate oxide G02, and a gate electrode G2 is formed exists on the surface of the n-well NW. In this PMOS region, n-type diffusion layers ND1 and ND2 are further formed as terminals of the back gate Nw of the p-channel MOS transistor, and biased to a predetermined voltage level via a terminal Vnw when the circuit 2 is in the ON state.

This structure allows independent setting of the back-gate potentials of the PMOS and NMOS transistors.

As shown in FIG. 22, parasitic diodes DP exist between the p-type diffusion layers PD11 and PD12 serving as the source and drain of the p-channel MOS transistor, and the n-type diffusion layers ND11 and ND12 formed as terminals of the back gate Nw. In the transmission gate circuit 2 shown in FIG. 21, therefore, the parasitic diodes DP respectively exist between one terminal of the p-channel MOS transistor P1 and the back gate Nw and between one terminal of the p-channel MOS transistor P3 and the back gate Nw.

The presence of the parasitic diodes DP poses the following problems when the transmission gate circuit 2 is in the OFF state, the other transmission gate circuit 3 having the output terminal OUT2 connected to the common bus line BL is in the ON state, and the bus line BL receives a high-level signal.

The transmission gate circuit 2 is in the OFF state, and the switch SW connects the ground terminal to the power supply terminal 10. If the enable signal /EN2 changes to high level, the transmission gate circuit 3 is turned conductive. If a signal of power supply voltage vcc level is input to the input terminal IN2, a signal identical to the power supply voltage Vcc is output onto the bus line BL via the output terminal OUT2.

Let Vf be the built-in potential of the parasitic diode DP present between the drain of the transistor P1 and the back gate Nw. In the transmission gate circuit 2, if the power supply voltage Vcc is higher than the potential vf, the parasitic diode DP is forward-biased. Then, the power supply voltage Vcc on the bus line BL flows a wasteful current to the semiconductor substrate via the output terminal OUT1, the drain and parasitic diode DP of the transistor P1, and the back gate Nw. Moreover, a wasteful current flows to the ground potential via the parasitic diode between the transistor P3 and the grounded terminal 10. Since a signal VGP changes to the ground potential, the PMOS transistor P1 is turned conductive to electrically connect the terminals B and A and flow a current from the terminal B to the terminal A.

This current is generated by the presence of the p-channel MOS transistor in the transmission gate circuit 2. To eliminate this current, the transmission gate circuit 2 may be constituted by only the n-channel MOS transistor N1, and the transistors N1N and N2N may be formed as a body effect compensation circuit for the transistor N1, like a transmission gate circuit 4 shown in FIG. 24.

The transmission gate circuit 4, which transfers a signal by only the n-channel MOS transistor N1, can transfer the ground potential Vss of the terminal A to the bus line BL without any drop. However, it cannot transfer the power supply voltage Vcc without any drop. In other words, the transmission gate circuit 4 can only output to the bus line BL a voltage Vcc-Vthn which has dropped by the threshold voltage Vthn of the transistor N1. As the voltage of a signal to be output comes close to the power supply voltage Vcc, the resistance of the transistor N1 increases to decrease the response speed and cause a signal delay.

In the above description, the problem in the circuit of FIG. 21 arises when the power supply terminal 10 is grounded at the switch SW for switching the power supply terminal 10 between the power supply voltage Vcc terminal and ground terminal.

This problem also arises even with a switch for switching the power supply terminal 10 between the power supply voltage Vcc terminal and open terminal. This will be explained.

In an OFF state in which the power supply terminal 10 is grounded, a steady current may flow from the bus line to the ground potential. In an OFF state in which the power supply terminal 10 is opened, a current for charging the capacitance component present at the open terminal flows from the bus line to the open terminal. This current becomes an extra capacitance load on the bus line when viewed from the circuit 3 which drives the bus line. That is, the current adversely decreases the signal change speed on the bus line.

As described above, in the transmission gate circuits shown in FIGS. 21 to 23, when a plurality of transmission gate circuits are connected to the common bus line, at least one transmission gate circuit is OFF, and another transmission gate circuit outputs a signal higher than the ground voltage Vss to the bus line, a current flows through the parasitic diode of the OFF transmission gate circuit to wastefully consume power.

In addition, a transmission gate circuit, which is constituted without using any p-channel MOS transistor in order to prevent generation of this current, cannot output a signal which swings fully from the ground voltage Vss to the power supply voltage Vcc.

SUMMARY OF THE INVENTION

It is, therefore, an object of the present invention to provide a transmission gate circuit capable of preventing an unwanted current from flowing from the bus line to the substrate via the parasitic diode in the OFF transmission gate circuit when a signal higher than the ground potential is output onto the bus line, and outputting a signal which swings fully within the voltage range in use.

According to the present invention, there is provided a transmission gate circuit comprising a body effect compensation circuit including a switch for switching and supplying to a power supply terminal a power supply voltage and a ground potential or an open terminal potential substantially equal to the ground potential, a first, p-channel MOS transistor which has one and the other terminals respectively connected between first and second terminals and a gate for receiving a first control signal, a second, p-channel MOS transistor for short circuit which has one and the other terminals respectively connected to a source and back gate of the first transistor, and receives the first control signal at a gate for short-circuiting the source and back gate when the power supply voltage is supplied to the power supply terminal and the first transistor is turned conductive, and a third, p-channel MOS transistor for connecting the power supply terminal which has one terminal connected to the back gate of the first transistor, the other terminal and back gate connected to a first node, and a gate for receiving a second control signal in order to connect the back gate of the first transistor to the power supply terminal when the power supply voltage is supplied to the power supply terminal and the first transistor is turned non-conductive, a diode having a cathode connected to the first node and an anode connected to the power supply terminal, a first control circuit which is connected to the first node, receives a third control signal, and outputs a potential of the first node or the ground potential as the first control signal in accordance with a switching state of the switch, and a second control circuit which is connected to the first node or power supply terminal, and outputs the potential of the first node or the potential of the power supply terminal, and the ground potential, as the second control signal in accordance with the first control signal.

This transmission gate circuit of the present invention can output a voltage which swing fully from the ground voltage to the power supply voltage in the ON state. In addition, even if a voltage higher than the ground voltage is applied to the bus line in the OFF state in which no power supply voltage is supplied, this circuit can prevent an unwanted current from flowing from one terminal connected to the bus line to the other terminal via a MOS transistor constituting the transmission gate. Further, the circuit can prevent an unwanted current from flowing to the back gate via the parasitic diode, thereby contributing to reduction in power consumption.

When the power supply voltage or open terminal voltage is supplied to the power supply terminal by the switch, the first control circuit may output the potential of the first node or ground potential as the first control signal in accordance with the third control signal to conductive/non-conductive-control the first and second MOS transistors. When the power supply voltage is supplied to the power supply terminal by the switch, the second control circuit may output the potential of the first node or the potential of the power supply terminal, and the ground potential as the second control signal in accordance with the first control signal to conductive/non-conductive-control the third MOS transistor, and when the ground potential or open terminal potential is supplied to the power supply terminal by the switch, may turn conductive the third MOS transistor to set the back gate of the first transistor, the first node, and the first control signal to the same potential, supply the potential to the gates of the first and second MOS transistors, and turn non-conductive the first and second MOS transistors.

The first control circuit may comprise a first logic gate which has one terminal for receiving the third control signal, the other input terminal for receiving the power supply potential, ground potential, or open terminal potential via the switch, and a power supply terminal connected to the first node, and supplies an output to the gates of the first and second MOS transistors, and when the switch is switched to the ground potential or open terminal potential, may supply the potential of the back gate of the first MOS transistor to the output of the first logic gate, and the second control circuit may comprise a second logic gate which receives an output from the first logic gate, has a power supply terminal connected to the first node or power supply terminal, and supplies an output to the gate of the third MOS transistor, and when the switch is switched to the ground potential or open terminal potential, may supply the ground potential to the output of the second control circuit.

The first control circuit may be a NAND gate, and the second control circuit may be an inverter.

The first control circuit may comprise a first logic circuit which has a plurality of input terminals for receiving a plurality of control signals, a power supply terminal connected to the first node, and supplies an output to the gates of the first and second MOS transistors, a fourth, p-channel MOS transistor which has one terminal connected to the first node, the other terminal connected to the output of the first logic circuit, and a gate connected to the power supply potential, ground potential, or open terminal potential via the switch, and when the switch is switched to the ground potential or open terminal potential, transfers to the output of the first logic circuit the potential of the back gate of the first transistor transferred to the first node via the third MOS transistor, and a fifth, n-channel MOS transistor which is formed between the ground potential and the output of the first logic circuit, has a gate connected to the power supply potential, ground potential, or open terminal potential via the switch, and when the switch is switched to the ground potential or open terminal potential, isolates the ground potential and the output.

Alternatively, the first control circuit may comprise a third logic gate which has an input terminal for receiving a control signal and a power supply terminal for receiving the power supply potential via the switch, and supplies an output to a fourth logic gate, and a fourth logic gate which has an input terminal for receiving the output and a power supply terminal connected to the first node, and supplies an output to the gates of the first and second MOS transistors, and when the switch is switched to the ground potential or open terminal potential, may supply to the output of the fourth logic gate the potential of the back gate of the first transistor transferred to the first node via the third MOS transistor.

The third and fourth logic gates may be inverters.

The first control circuit may comprise a second logic circuit which has a plurality of input terminals for receiving a plurality of control signals and a power supply terminal connected to the first node, and supplies an output to the gates of the first and second MOS transistors, and an inverter which has an input terminal for receiving an arbitrary control signal and a power supply terminal connected to the power supply potential, ground potential, or open terminal potential via the switch, and supplies an output as the control signal to the input terminal of the second logic circuit, and when the switch is switched to the ground potential or open terminal potential, may supply to the output of the second logic circuit the potential of the back gate of the first transistor transferred to the first node via the third MOS transistor.

The first control circuit may comprise a third logic circuit which has a plurality of input terminals for receiving a plurality of control signals and a power supply terminal connected to the first node, and supplies an output to the gates of the first and second MOS transistors, an inverter which has an input terminal for receiving an arbitrary control signal or open terminal potential and a power supply terminal connected to the power supply potential or ground potential via the switch, a sixth, p-channel MOS transistor which has one terminal connected to the first node, the other terminal connected to the output of the third logic circuit, and a gate connected to the output of the inverter, and a seventh, n-channel MOS transistor which is formed between the ground potential and the output of the third logic circuit and has a gate connected to the output of the inverter, and when the switch is switched to the ground potential or open terminal potential, may transfer to the output of the third logic circuit the potential of the back gate of the first transistor transferred to the first node via the third MOS transistor, and may isolate the ground potential and the output.

According to the present invention, there is provided a transmission gate circuit comprising a body effect compensation circuit including a switch for switching and supplying to a power supply terminal a power supply voltage and a ground potential or open terminal potential substantially equal to the ground potential, a first, p-channel MOS transistor which has one and the other terminals respectively connected between first and second terminals and a gate for receiving a first control signal, a second, p-channel MOS transistor for short circuit which has one and the other terminals respectively connected to a source and back gate of the first transistor, and receives the first control signal at a gate for short-circuiting the source and back gate when the power supply voltage is supplied to the power supply terminal and the first transistor is turned conductive, and a third, p-channel MOS transistor for connecting the power supply terminal which has one terminal connected to the back gate of the first transistor, the other terminal and back gate connected to a first node, and a gate for receiving a second control signal in order to connect the back gate of the first transistor to the power supply terminal when the power supply voltage is supplied to the power supply terminal and the first transistor is turned non-conductive, a diode having a cathode connected to the first node and an anode connected to the power supply terminal, a third control circuit which is connected to the power supply terminal, has one or a plurality of input terminals for receiving a control signal and a power supply terminal connected to the power supply potential, ground potential, or open terminal potential via the switch, and supplies an output as the second control signal to the gate of the third MOS transistor, and a fourth control circuit which has an input terminal connected to the output of the third control circuit and a power supply terminal connected to the first node, and supplies an output as the first control signal to the gates of the first and second MOS transistors, wherein when the ground potential or open terminal potential is supplied to the power supply terminal by the switch, the third MOS transistor is turned conductive to set the back gate of the first transistor, the first node, and the first control signal at the same potential, supply the potential to the gates of the first and second MOS transistors, and turn non-conductive the first and second MOS transistors.

When the power supply voltage or open terminal voltage is supplied to the power supply terminal by the switch, the third control circuit may output a potential corresponding to one or a plurality of control signals as the second control signal to conductive/non-conductive-control the third MOS transistor. When the power supply voltage is supplied to the power supply terminal by the switch, the fourth control circuit may output a potential corresponding to the second control signal as the first control signal to conductive/non-conductive-control the first and second MOS transistors, and when the ground potential or open terminal potential is supplied to the power supply terminal by the switch, may turn conductive the third MOS transistor to set the back gate of the first transistor, the first node, and the first control signal at the same potential, supply the potential to the gates of the first and second MOS transistors, and turn non-conductive the first and second MOS transistors.

The diode may be a MOS transistor having a gate and one of a drain and source connected to the first node, the other one of the drain and source connected to the power supply terminal, and a back gate connected to the first node.

The diode may be an npn bipolar transistor having an emitter connected to the first node, a collector connected to the power supply terminal, and a base connected to the first node.

The diode may comprise an eighth, p-channel MOS transistor having one of a drain and source connected to the first node, the other one of the drain and source connected to the power supply terminal, and a back gate connected to the first node, and a bias circuit for supplying the potential of the first node to a gate of the eighth MOS transistor when the ground potential or open terminal potential is supplied to the power supply terminal by the switch, and supplying the ground potential when the power supply potential is supplied by the switch.

The bias circuit may be an inverter having an input terminal connected to the power supply terminal, a power supply terminal connected to the first node, and an output connected to the gate of the eighth MOS transistor.

The body effect compensation circuit may include a CMOS transmission gate in which a ninth, n-channel MOS transistor is parallel-connected to the second MOS transistor and the second control signal is supplied to the gate of the first MOS transistor.

The transmission gate circuit of the present invention further comprises a body effect compensation circuit including a 10th, n-channel MOS transistor which has one and the other terminals respectively connected between the first and second terminals and a gate for receiving the second control signal, and is parallel-connected to the first, p-channel MOS transistor, a 11th, n-channel MOS transistor for short circuit which has one and the other terminals respectively connected between a source and back gate of the 10th transistor, and receives the second control signal at a gate for short-circuiting the source and back gate when the power supply voltage is supplied to the power supply terminal and the 10th transistor is turned conductive, a 12th, p-channel MOS transistor which is parallel-connected to the 10th MOS transistor, and has a back gate connected to the back gate of the first MOS transistor and a gate for receiving the first control signal, and a 12th, n-channel MOS transistor for connecting the ground potential which has one terminal connected to the back gate of the 10th transistor, the other terminal and back gate connected to the ground potential, and a gate for receiving the first control signal in order to connect the back gate of the 10th transistor to the ground potential when the power supply voltage is supplied to the power supply terminal and the 10th transistor is turned non-conductive.

BRIEF DESCRIPTION OF THE DRAWINGS

In the accompanying drawings.

DESCRIPTION OF THE PREFERRED EMBODIMENTS

Embodiments of the present invention will be described below with reference to the accompanying drawings. The following embodiments comprise not only the body effect compensation function but also a power-off tolerant function, i.e., a function of, when a voltage higher than the ground voltage exists on the bus line, preventing any unwanted current from flowing to the substrate via the parasitic diode in the transmission gate circuit which has a power supply node connected to the ground terminal or open terminal at almost the ground potential and is in the OFF state. Further, a potential within the voltage range in use can be transferred without any voltage drop.

Figure 1:
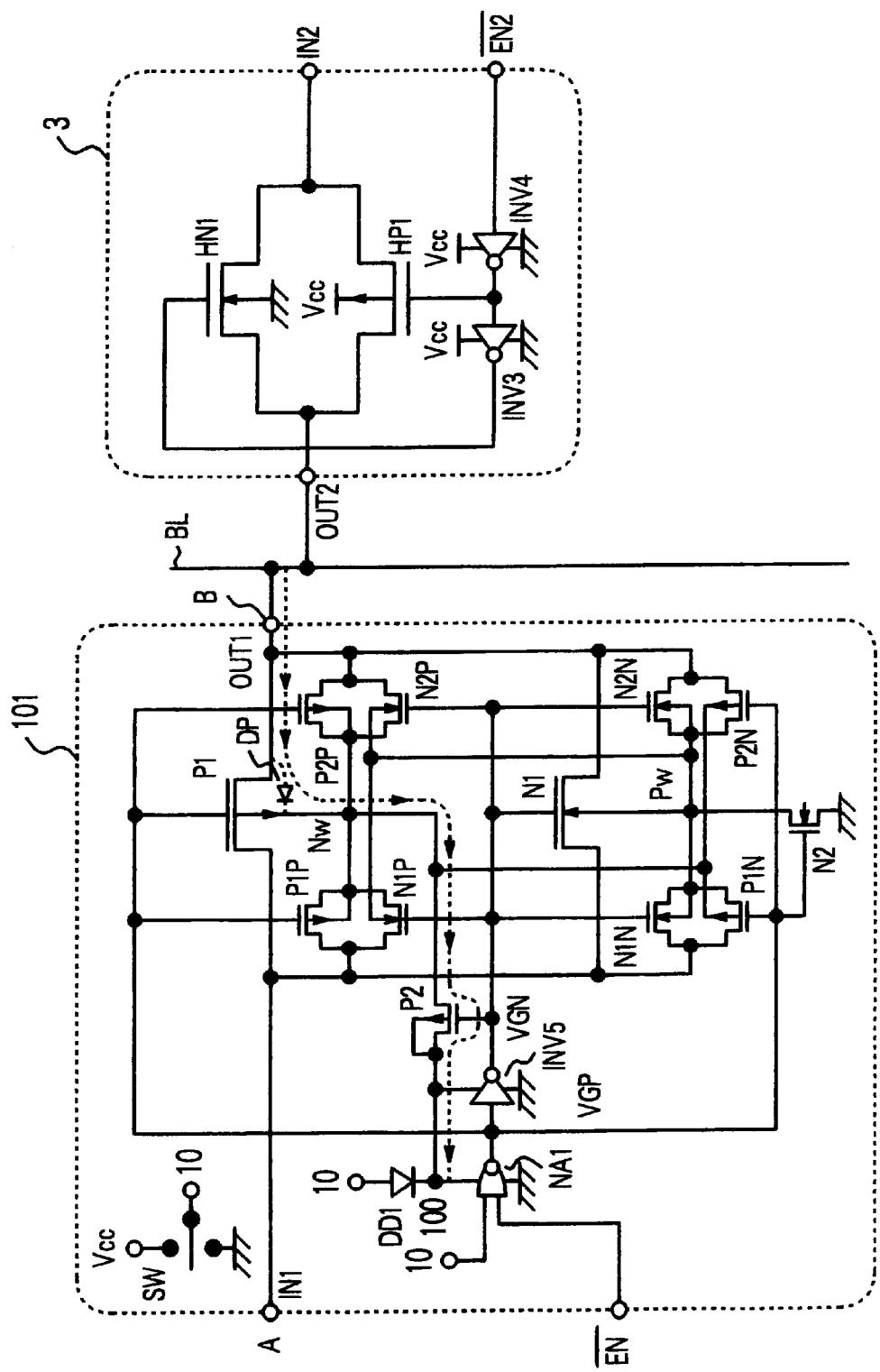
FIG. 1 is a circuit diagram showing the arrangement of a transmission gate circuit according to the first embodiment of the present invention.

FIG. 1 shows the arrangement of a transmission gate circuit according to the first embodiment. Output terminals OUT1 and OUT2 of two transmission gate circuits 101 and 3 are connected to a bus line BL. The transmission gate circuit 3 is identical to the circuit 3 shown in FIG. 21, and a description thereof will be omitted.

Figure 21:
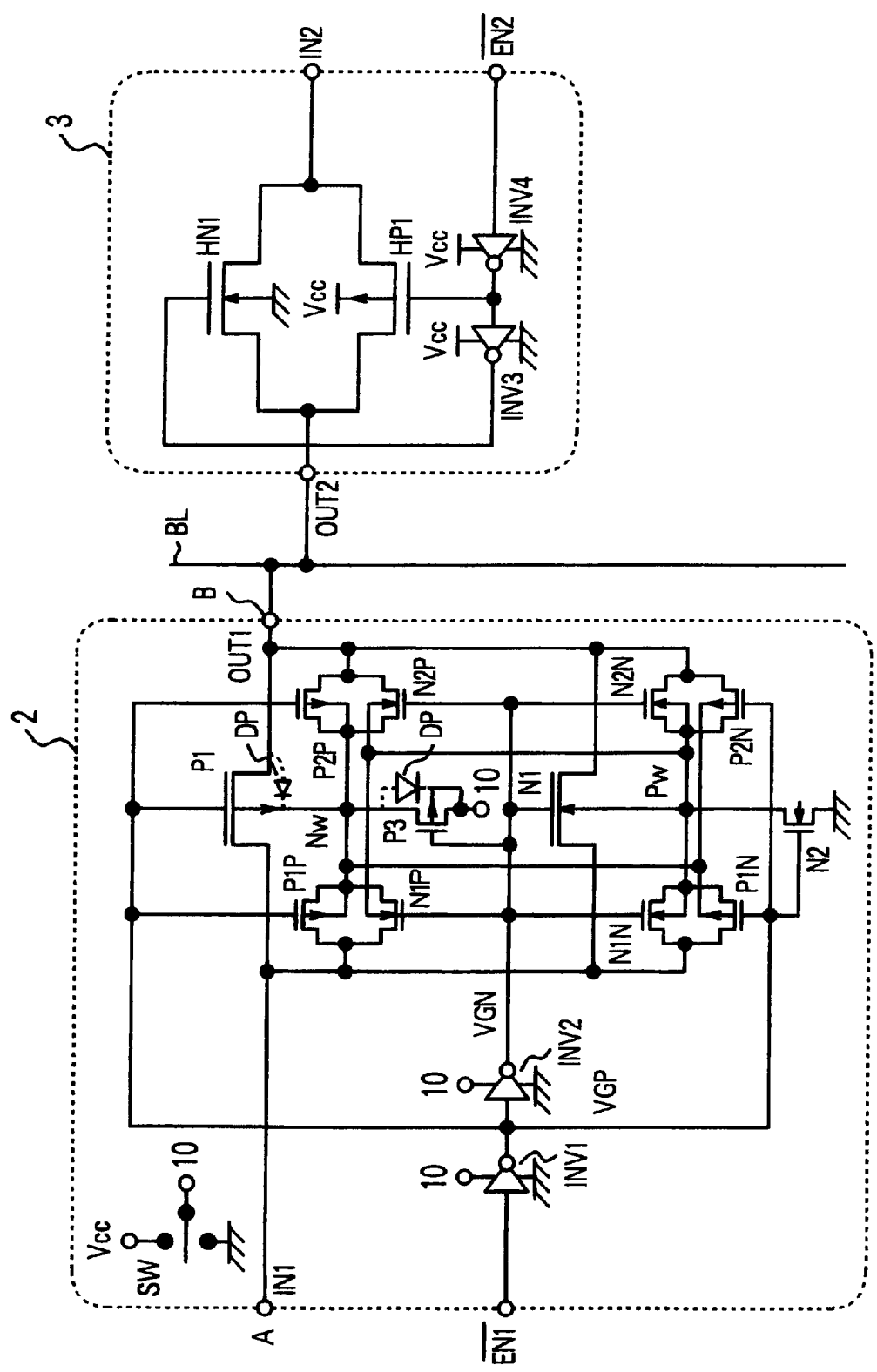
FIG. 21 is a circuit diagram showing the arrangement of a transmission gate circuit related to the present invention.
Figure 22:
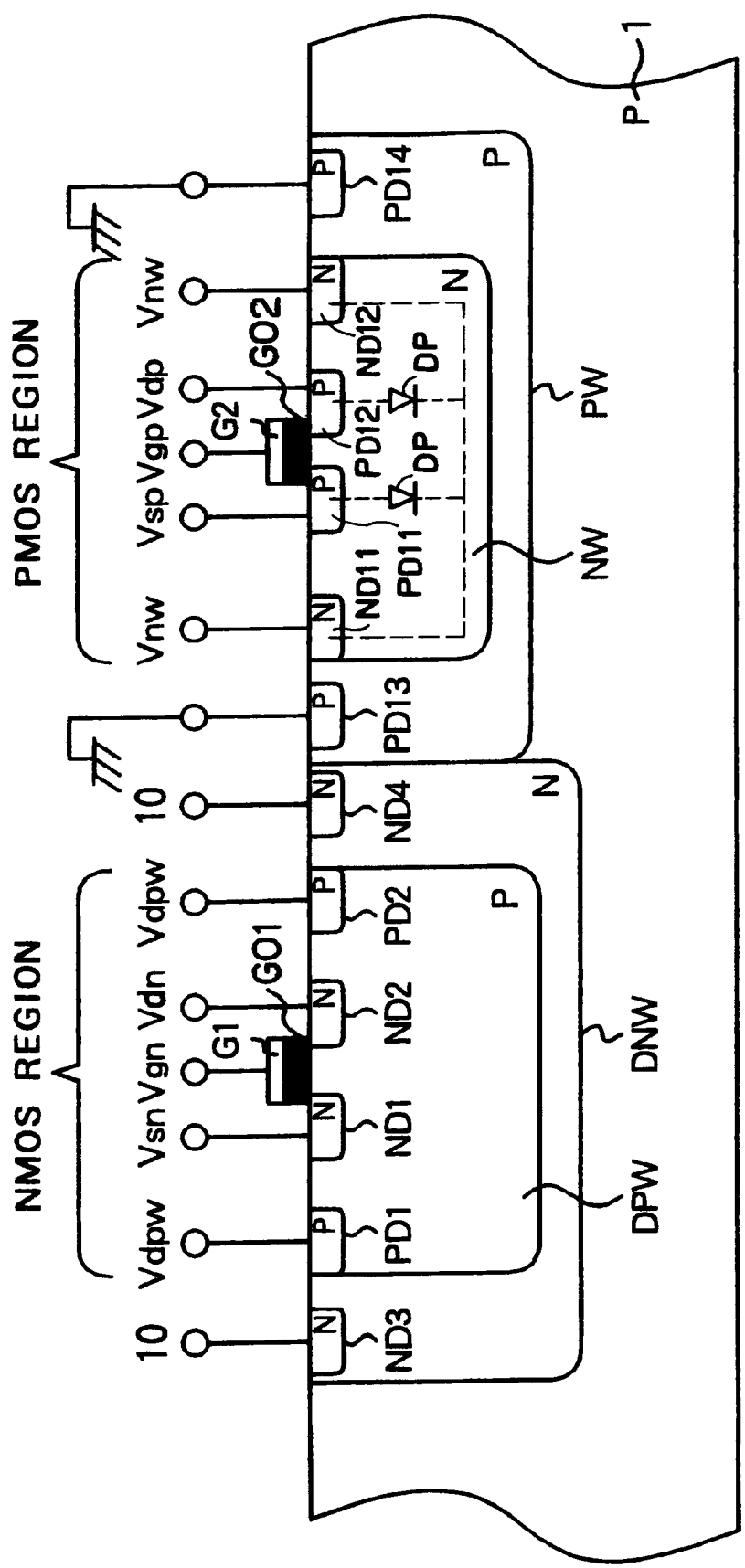
FIG. 22 is a longitudinal sectional view showing a device structure in the transmission gate circuit.
Figure 23:
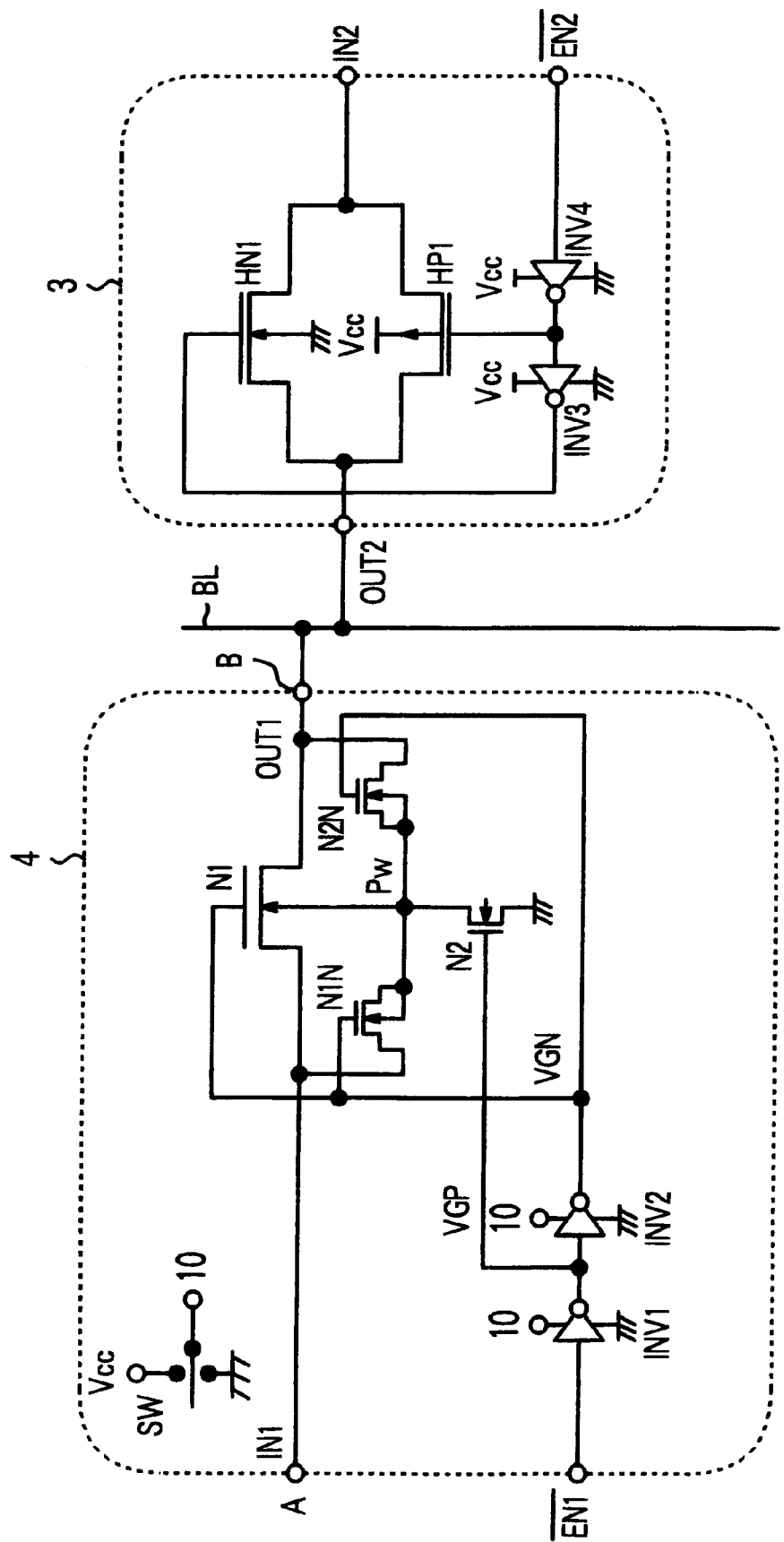
FIG. 23 is a circuit diagram showing the arrangement of another transmission gate circuit related to the present invention.

The transmission gate circuit 101 according to the first embodiment comprises an analog switch made up of transistors P1 and N1 in the transmission gate circuit 2 shown in FIG. 21, a body effect compensation circuit for the transistor P1 which is made up of transistors P1P, N1P, P2P, N2P, and P2, a body effect compensation circuit for the transistor N1 which is made up of transistors P1N, N1N, P2N, N2N, and N2, and a switch SW for connecting a power supply terminal 10 to the ground terminal or power supply voltage Vcc terminal. Further, the transmission gate circuit 101 comprises, a diode DD1, a NAND circuit NA1, and an inverter INV5 as a circuit having the power-off tolerant function. The transistor P2 of the body effect compensation circuit replaces the transistor P3 in FIG. 21, and realizes the power-off tolerant function by operation (to be described later) together with the diode DD1, NAND circuit NA1, and inverter INV5. The same reference numerals as in FIG. 21 denote the same parts.

The diode DD1 has an anode connected to the power supply terminal 10 and a cathode connected to a node 100 which is connected to the power supply terminals of the NAND circuit NA1 and inverter INV5. The NAND circuit NA1 has one input terminal connected to the power supply terminal 10 and the other input terminal which receives an enable signal /EN. The output terminal of the NAND circuit NA1 is connected to the input terminal of the inverter INV5, the output terminal of which outputs a control signal VGN to the gates of the transistors P2, N1, N1P, N2P, N1N, and N2N. The transistor P2 has one terminal connected to the node 100 and the other terminal connected to a back gate Nw of the transistor P1. The output terminal of the NAND circuit NA1 outputs a control signal VGP obtained by inverting the polarity of the enable signal /EN to the gates of the transistors P1, P1P, P2P, P1N, P2N, and N2.

Operation of the transmission gate circuit 101 according to the first embodiment will be explained. When the power supply voltage Vcc is supplied to the power supply terminal 10 by the switch SW, if the transmission gate circuit 101 is in the ON state, it operates as follows.

A power supply voltage Vcc-Vf is supplied to the NAND circuit NA1 and inverter INV5 via the diode DD1 and node 100 to turn on the transmission gate circuit 101. The voltage Vf is the p-n junction built-in potential of the diode DD1. The NAND circuit NA1 receives a high-level enable signal /EN at one input terminal and the power supply voltage Vcc at the other input terminal, and outputs a low-level control signal VGP. Then, the transistors P1, P1P, P2P, P1N, and P2N are turned conductive and the transistor N2 is turned non-conductive. The inverter INV5 outputs a high-level control signal VGN to turn non-conductive the transistor P2 and turn conductive the transistors N1, N1N, N2N, N1P, and N2P.

Since the transistors P1 and N1 are turned conductive, input and output terminals A and B of the transmission gate circuit 101 conduct current. Further, the transistors P1P, N1P, P2P, and N2P constituting the body effect compensation circuit are turned conductive to short-circuit the source and back gate Nw of the transistor P1. The transistors N1N, P1N, N2N, and P2N are turned conductive to short-circuit the source and back gate Pw of the transistor N1, thereby compensating for the body effect.

When the transmission gate circuit 101 is in the ON state and the enable signal /EN is at low level, a high-level control signal VGP and a low-level control signal VGN are generated. The transistors P1, P1P, P2P, P1N, P2N, N1, N1N, N2N, N1P, and N2P are turned non-conductive to set a high-impedance state between the input and output terminals A and B. The transistor P2 is turned conductive to connect the back gate Nw to the power supply terminal 10 via the node 100 and diode DD1. The transistor N2 is turned conductive to ground the back gate Pw, thereby preventing the back gates Nw and Pw from floating.

Both the control signals VGP and VGN have high level of voltage Vcc-Vf. When this voltage Vcc-Vf is applied to the gate of the p-channel MOS transistor, the transistor seems not to completely turn non-conductive compared to application of the power supply voltage Vcc. For example, the control signal VGP changes to the voltage Vcc-Vf by a low-level enable signal /EN, and if the voltage Vcc is applied to either the terminal A or B, none of the transistors P1, P1P, P2P, P1N, and P2N seem not to completely turn non-conductive. However, this does not interfere with operation of the transmission gate circuit 101, as will be described below. Assume that the voltage Vcc and ground potential Vss are respectively applied to the terminals B and A.

(a) Transistor P1

The transistor P1 has a gate-source voltage that is obtained by subtracting Vcc from Vcc-Vf, i.e., -Vf. Letting Vthp be the threshold voltage of the p-channel MOS transistor, apparently the transistor P1 is completely turned non-conductive since $|Vthp|>>Vf$. This is because the current path from the back gate Nw of the p-channel MOS transistor to the ground terminal is only a path of a leakage current and the voltage Vf in this case is not as high as 0.6 V generally occurring as a potential across a p-n junction but is small, near 0.

(b) Current Path to Terminal A via Transistor P1P

The voltage Vcc applied from the bus line BL to the terminal B is transferred to the back gate Nw via the parasitic diode DP of the transistor P1, so that the potential at this portion changes to Vcc-Vf. Since the source of the transistor P1P is connected to the high-potential n-well Nw, and its gate-source voltage changes to (Vcc-Vf)–(Vcc-Vf), i.e., 0 V, the transistor P1P is completely turned non-conductive.

(c) Current Path to Ground Potential via Transistor P2

The transistor P2 is conductive because its gate receives a control signal VGN equal to the ground voltage Vss. The voltage of the back gate Nw is transferred to the node 100 on the cathode side of the diode DD1. The NAND circuit NA1 receives a high-level Vcc enable signal /EN at one input terminal, and outputs a high-level (Vcc-Vf) signal from the output terminal to the inverter INV5. Then, since the p-channel MOS transistor in the inverter INV5 receives the high-level (Vcc-Vf) signal at the gate and the voltage (Vss-Vf) of the node 100 at the source, and the potential between the gate and source changes to 0, the transistor is turned non-conductive. Therefore, no current path exists between the node 100 and ground potential terminal.

(d) Current Path to Terminal A via Transistor P1N

Both the terminal A connected to one terminal of the transistor P1N and the back gate Pw connected to the other terminal are at the ground voltage Vss level, and both the source and drain are at the same voltage. The gate receives the control signal VGP of Vcc-Vf level, and thus the transistor P1N is completely turned non-conductive not to form any current path.

(e) Current Path to Ground Potential via Transistor P2N

The transistor P2N receives the voltage Vcc-Vf as a control signal VGP at the gate and the voltage Vcc of the bus line BL at the source, and the gate-source voltage changes to -Vf. Evidently, the transistor P2N is completely turned non-conductive because $|Vthp|>>Vf$. Hence, the transistor P2N does not form any current path from the transistor P2N to the ground potential via the transistor N2.

As described above, no current path from the terminal B to the ground voltage Vss terminal, power supply terminal 10, and terminal A exists.

The following description concerns operation when the transmission gate circuit 101 is in the OFF state and a Vcc-level signal is output to the bus line BL by the other transmission gate circuit 3 connected to the common bus line BL. The power supply terminal 10 is connected to the ground terminal by the switch SW not to supply any power supply voltage Vcc. Thus, the potential of the node 100 does not change to power supply voltage Vcc level not to supply any power supply voltage Vcc to the NAND circuit NA1 and inverter INV5.

If a signal of power supply voltage vcc level is output to the bus line BL, this signal is applied to the terminal B, and the parasitic diode DP between the source and back gate Nw of the transistor P1 is forward-biased to transfer the potential Vcc-Vf to the back gate Nw. The inverter INV5 outputs a low-level control signal VGN to the gate of the transistor P2, as will be described below. The transistor P2 receives the signal of Vcc-Vf level at its source via the back gate Nw and is turned conductive. The signal of Vcc-Vf level is transferred to the node 100 via the transistor P2. Even if the node 100 changes to Vcc-Vf level, the power supply terminal 10 is kept grounded, and the diode DD1 is reverse-biased not to flow any current to the power supply terminal 10, thereby preventing wasteful current consumption.

Since the potential of the node 100 changes to Vcc-Vf level, the potential of Vcc-Vf level is applied to the power supply terminals of the NAND circuit NA1 and inverter INV5 instead of the power supply voltage Vcc. Since one input terminal of the NAND circuit NA1 receives a low-level (ground-level) signal from the power supply terminal 10, the NAND circuit NA1 outputs a control signal VGP of Vcc-Vf level as a potential of the node 100 regardless of the level of the enable signal /EN. This control signal VGP is input to the gate of the transistor P1 to completely turn non-conductive the transistor P1 since $|Vthp|>>Vf$. The control signal VGP is also input to the gates of the transistors P1P, P2P, P1N, and P2N to turn them non-conductive, turn conductive the transistor N2, and ground the back gate Pw.

If the gate potential of the transistor P1 is kept at low level, like the prior art, a high potential is applied to the terminal B via the bus line BL to turn conductive the transistor P1 and wastefully flow a current. In the first embodiment, however, a high potential of the bus line BL is applied to the gate of the transistor P1 via the terminal B, back gate Nw, transistor P2, node 100, and NAND circuit NA1 to turn non-conductive the PMOS transistors P1, P1P, P2P, P1N, and P2N, thereby reducing power consumption without forming any path of a wasteful current.

The inverter INV5 receives a potential of Vcc-Vf level of the node 100 as a power supply voltage and a high-level control signal VGP output from the NAND circuit NA1, and outputs a low-level control signal VGN equal to the ground voltage Vss. The signal VGN is supplied to the gate of the transistor P2 to turn it conductive, as mentioned above. The ground-level signal VGN is supplied to the gates of the transistors N1, N1P, N2P, N1N, and N2N to turn them non-conductive.

As a result, the transistors P1, P1P, P2P, P1N, and P2N prevent any steady current from flowing between the source and back gate Nw via the parasitic diode DP, in addition to the drain-source current.

Since the transistors N1, N1P, N2P, N2N, and N1N are also turned non-conductive as described above, the current path between the terminals B and A, the current path to the ground terminal, and the current path to the grounded power supply terminal 10 are all cut to prevent wasteful current consumption.

Figures 2A, 2B, 2C, 2D, 2E:
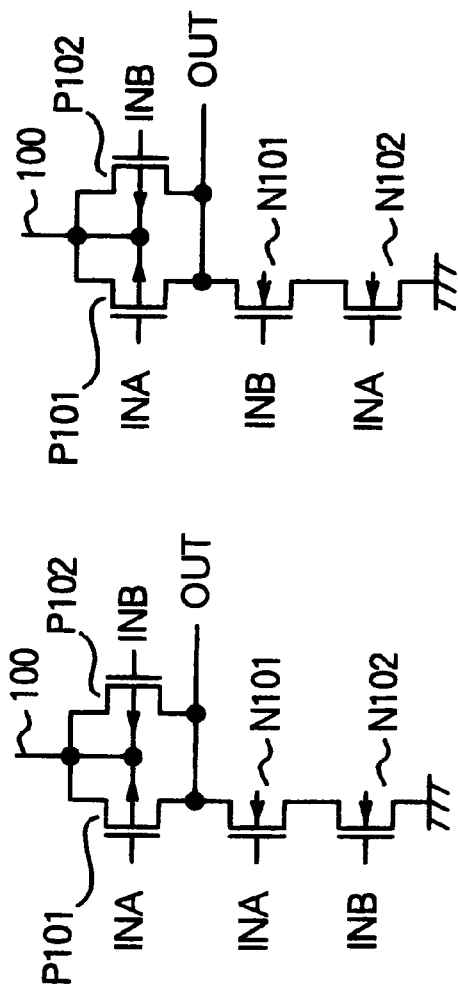
FIGS. 2A to 2E are circuit diagrams showing the detailed arrangements of a NAND circuit and inverter in the transmission gate circuit.

The NAND circuit NA1 in FIG. 1 can be expressed as an element which receives two signals INA and INB and outputs a signal OUT, as shown in FIG. 2A. The detailed arrangement of the NAND circuit NA1 is shown in FIGS. 2B and 2C. In the arrangement of FIG. 2B, the source-drain paths of p-channel MOS transistors P101 and P102 are parallel-connected between the power supply terminal 100 and an output terminal OUT, and their gates respectively receive the signals INA and INB. The drain-source paths of n-channel MOS transistors N101 and N102 are series-connected between the output terminal OUT and ground terminal, and their gates respectively receive the signals INA and INB. The arrangement of FIG. 2C is different from that of FIG. 2B in that signals input to the gates of the transistors N101 and N102 are exchanged and the signals INB and INA are respectively input thereto.

The inverter INV5 in FIG. 1 is expressed as an element which receives a signal IN and outputs a signal OUT, as shown in FIG. 2D. The detailed arrangement of the inverter INV5 is shown in FIG. 2E. The source-drain path of a p-channel MOS transistor P103 and the drain-source path of an n-channel MOS transistor N103 are series-connected between the power supply terminal 100 and ground terminal. Both the transistors P103 and N103 receive the signal IN at their gates to output the signal OUT from their drains.

Figure 3A:
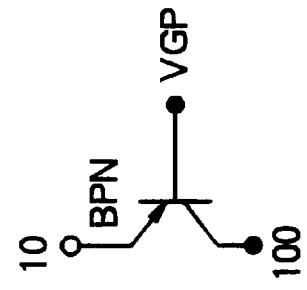
FIGS. 3A to 3F are circuit diagrams showing the detailed arrangement of a diode in the transmission gate circuit.
Figure 3B:
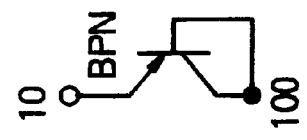
Figure 3C:
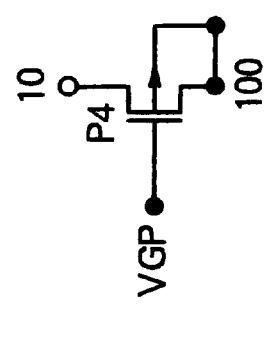
Figures 3D, 3E:
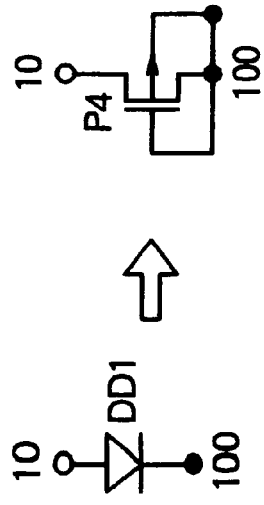

The diode DD1 in FIG. 1 is symbolized as shown FIG. 3A. As the diode DD1, an element having one of the arrangements shown in FIGS. 3B to 3E can be adopted. The diode shown in FIG. 3B is constituted by a p-channel MOS transistor P4 having a source connected to the power supply terminal 10 and a gate, drain, and back gate connected to the node 100. The diode shown in FIG. 3C is constituted by a p-channel MOS transistor P4 having a source connected to the terminal 10, a drain and back gate connected to the node 100, and a gate which receives the control signal VGP. The diode shown in FIG. 3D is constituted by a pnp bipolar transistor having an emitter connected to the terminal 10 and a base and collector connected to the node 100. The diode shown in FIG. 3E is constituted by a bipolar transistor having an emitter connected to the terminal 10, a collector connected to the node 100, and a base which receives the control signal VGP.

Figure 4:
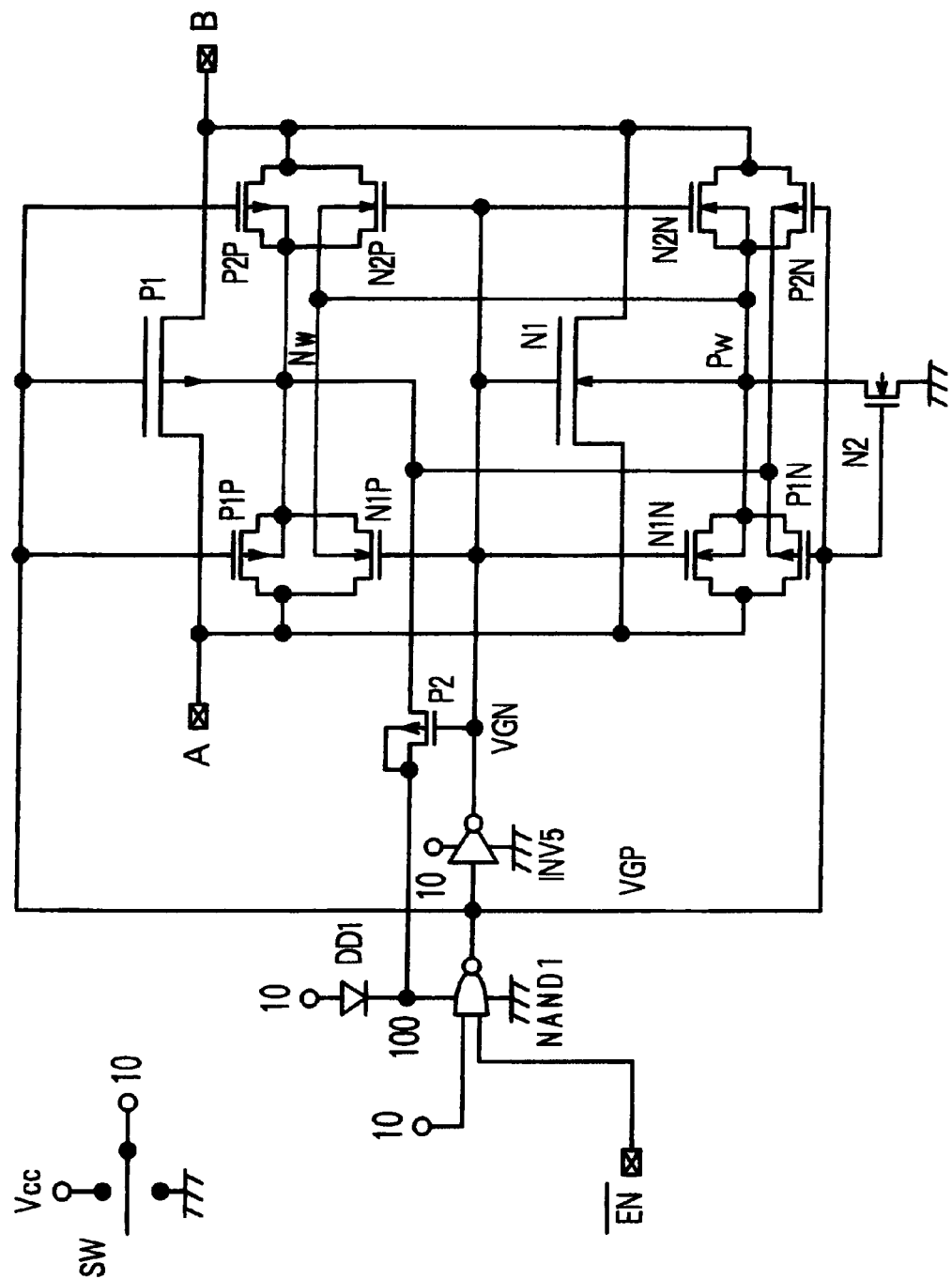
FIG. 4 is a circuit diagram showing the arrangement of a transmission gate circuit according to the second embodiment of the present invention.

A transmission gate circuit according to the second embodiment of the present invention has an arrangement as shown in FIG. 4. The second embodiment is different from the first embodiment only in that the power supply terminal of an inverter INV5 is directly connected to a power supply terminal 10 in place of a node 100. In the second embodiment, when the power supply terminal 10 is grounded and the circuit is in the OFF state, the control signal VGN always changes to the ground voltage Vss regardless of the level of the control signal VGP. For this reason, the transistors N1, N1P, N2P, N1N, and N2N are always turned non-conductive and the transistor P2 is turned conductive. The signal VGP changes similarly to the first embodiment. The second embodiment therefore operates similarly to the first embodiment. Note that when the power supply terminal 10 is connected to the power supply voltage Vcc terminal and the circuit is in the ON state, the inverter INV5 can swing fully from the ground voltage Vss to the power supply voltage Vcc.

Figure 3F:
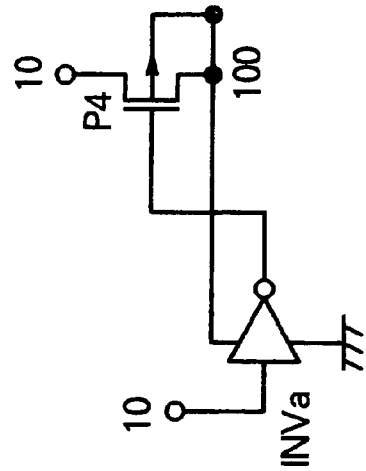

In the first embodiment, the high level of the control signals VGP and VGN is Vcc-Vf. However, if the circuit operates normally to supply the power supply voltage Vcc to the power supply terminal 10, the signals VGP and VGN desirably swing fully from the ground voltage Vss to the power supply voltage Vcc. For this purpose, a circuit as shown in FIG. 3F may replace the diode DD1. This circuit comprises an inverter INVa having an input terminal connected to the power supply terminal 10 and a power supply terminal connected to the node 100, and a p-channel MOS transistor P4 having a source connected to the power supply terminal 10, a gate connected to the output terminal of the inverter INVa, and a drain and back gate connected to the node 100.

Figure 5:
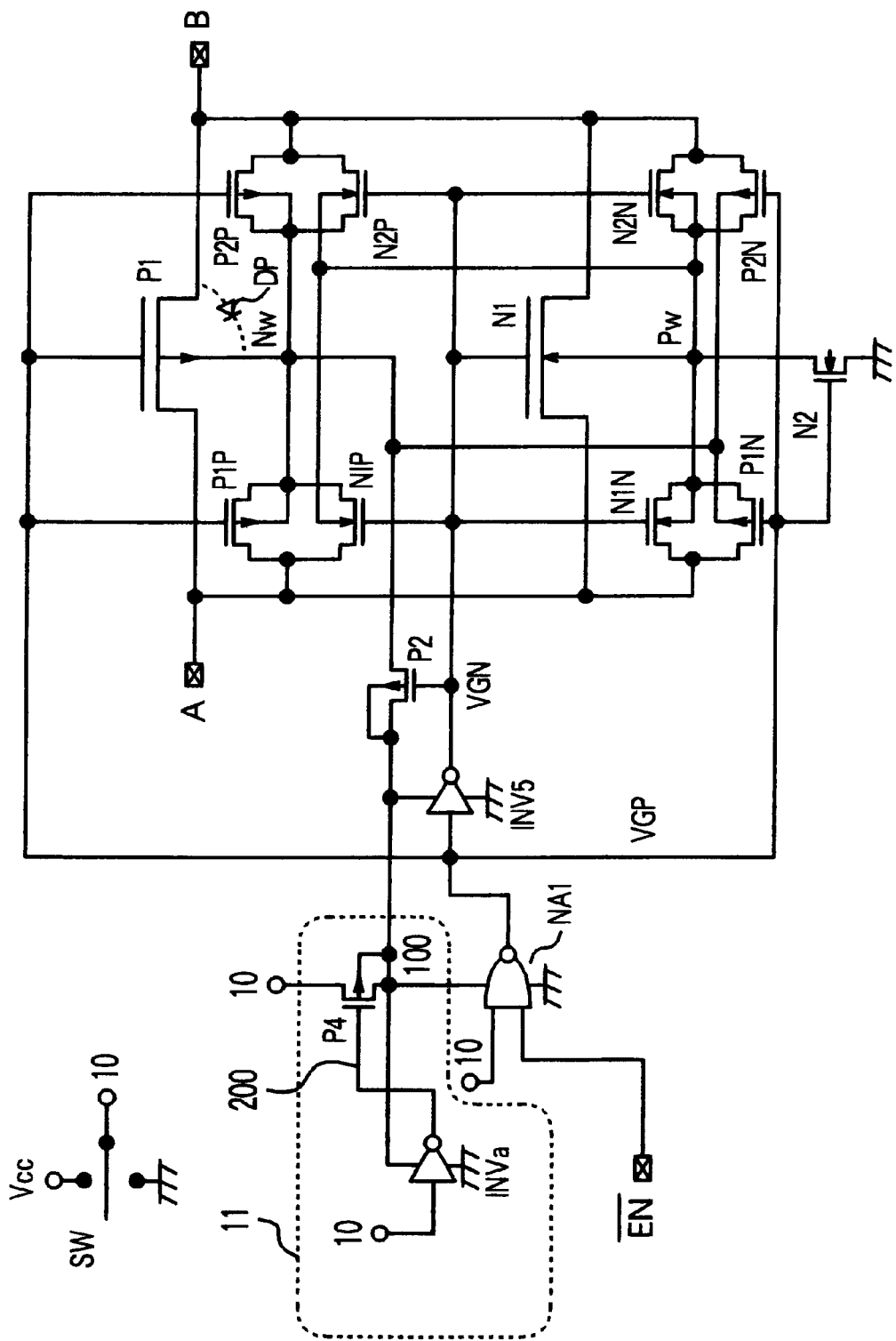
FIG. 5 is a circuit diagram showing the arrangement of a transmission gate circuit according to the third embodiment of the present invention.

In the third embodiment of the present invention, a circuit shown in FIG. 3F replaces the diode DD1 in the first embodiment. FIG. 5 shows the arrangement of this transmission gate circuit. When a power supply terminal 10 is connected to the power supply voltage vcc terminal, an output terminal 200 of an inverter INVa outputs a signal of ground voltage Vss level. This signal is input to the gate of a p-channel MOS transistor P4 to turn it conductive, and a node 100 changes to a level almost equal to the power supply voltage Vcc. As a result, a NAND circuit NA1 outputs a control signal VGP which swings fully from the ground voltage Vss to the power supply voltage Vcc, unlike the first and second embodiments in which voltage drop occurs by the diode DD1. In the third embodiment, an inverter INV5 also outputs a control signal VGN which swings fully from the ground potential to the power supply voltage Vcc. The power supply terminal of the inverter INV5 may be directly connected to a power supply terminal 10 in place of a node 100.

When the power supply terminal 10 is connected to the ground voltage Vss terminal, an n-channel MOS transistor constituting the inverter INVa is turned non-conductive, and a p-channel MOS transistor is turned conducitve. Then, a high potential of the node 100 is transferred to the output terminal 200 of the inverter INVa to turn non-conductive the transistor P4. The third embodiment operates similarly to the first and second embodiments using the diode DD1 instead of the circuit 11, and prevents formation of any path for flowing a wasteful current.

The fourth embodiment of the present invention will be described with reference to FIG. 6. The first to third embodiments employ the 2-input NAND circuit NA1 which receives the enable signal /EN and the potential of the power supply terminal 10. To the contrary, the fourth embodiment employs a logic circuit LC1 which receives N enable signals /EN1 to /ENN (N is an integer equal to or more than 2), an n-channel MOS transistor N3, and a p-channel MOS transistor P3, in place of the NAND circuit NA1.

The logic circuit LC1 has a power-supply-side terminal connected to a node 100, a ground-side terminal connected to the ground voltage Vss terminal via the drain-source path of the n-channel MOS transistor N3, and an output terminal for outputting the control signal VGP. The p-channel MOS transistor P3 has a source connected to the node 100 and a drain connected to the output terminal of the logic circuit LC1. The gates of the transistors P3 and N3 are connected to a power supply terminal 10.

When the power supply voltage Vcc is supplied to the power supply terminal 10 to turn on the circuit, the node 100 changes equal to power supply voltage Vcc level by a circuit 11 made up of an inverter INVa and a transistor P4. Thus, the power supply voltage Vcc is supplied to the logic circuit LC1, and the voltage of Vcc level is applied to the gate of the transistor N3 to turn it conductive, thereby grounding the ground-side terminal. The voltage Vcc is applied to the gate to turn non-conductive the transistor P3. The logic circuit LC1 is turned on to output control signals VGP corresponding to enable signals EN1 to ENN to turn conductive or non-conductive the transistors P1 and N1.

When the power supply terminal 10 is grounded to turn non-conductive the circuit, the transistor P4 of the circuit 11 is turned non-conductive not to supply any power supply voltage to the logic circuit LC1. Further, the transistor N3 is turned non-conductive to stop circuit operation without grounding the ground-side terminal. Since the transistor P3 is turned conductive, the output terminal of the logic circuit LC1 always outputs a control signal VGP of the same level as the node 100 regardless of the enable signals /EN1 to /ENN. In this way, the fourth embodiment also operates similarly to the first to third embodiments, and prevents formation of any wasteful current path.

The power-supply-side terminal of the inverter INV5 is connected to the node 100, similar to the first embodiment, but may be directly connected to the power supply terminal 10, similar to the second embodiment.

Figure 7C:
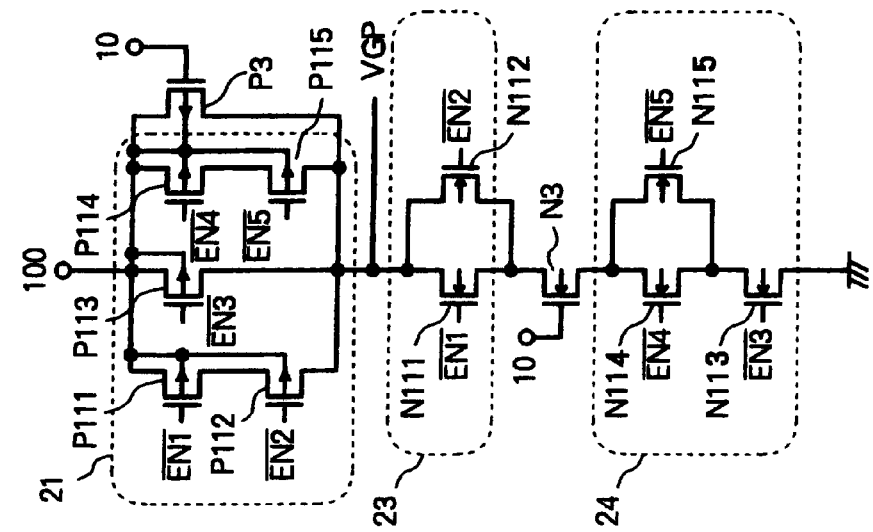
FIGS. 7A to 7C are circuit diagrams each showing the detailed arrangement of a logic circuit in the transmission gate circuit.
Figure 7B:
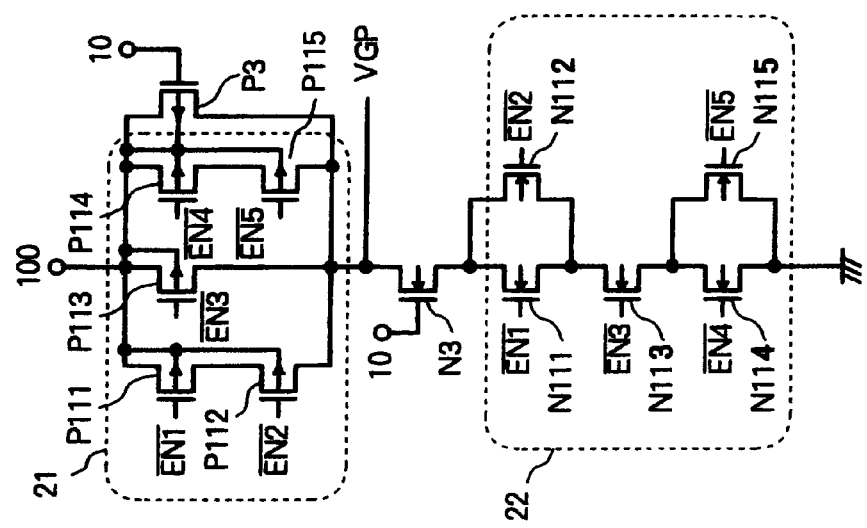
Figure 7A:
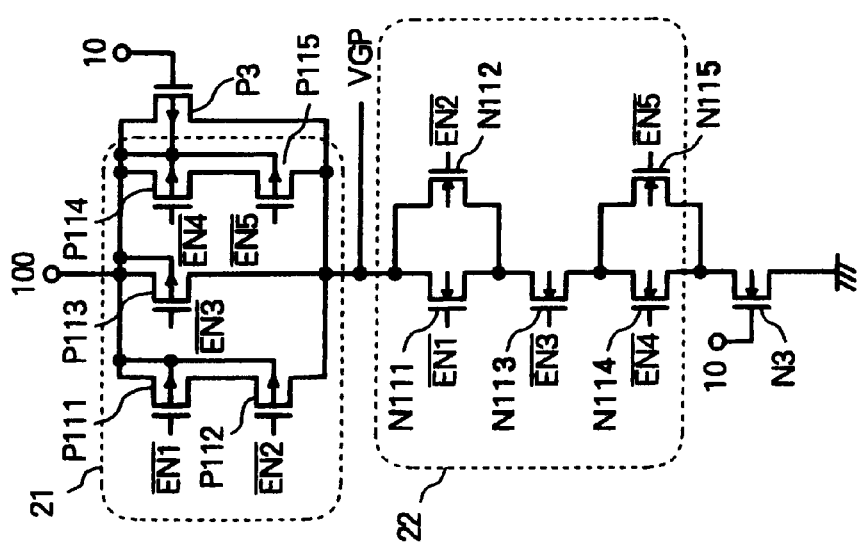

For five enable signals /EN, the circuit made up of the logic circuit LC1 and the transistors P3 and N3 may be built as shown in FIGS. 7A, 7B, or 7C. The circuit shown in FIG. 7A comprises a circuit 21 made up of p-channel MOS transistors P111 to P115, a circuit 22 made up of n-channel MOS transistors N111 to N115, and the n- and p-channel MOS transistors N3 and P3.

The source-drain paths of the p-channel MOS transistors P111 and P112 are series-connected between the power supply terminal 100 and a terminal for outputting the control signal VGP. The p-channel MOS transistor P113 is parallel-connected to this series circuit. A series circuit of the source-drain paths of the p-channel MOS transistors P114 and P115 is parallel-connected to the transistor P113. The gates of the transistors P111 to P115 respectively receive the enable signals /EN1 to /EN5.

The drain-source paths of the n-channel MOS transistors N111, N113, and N114 are series-connected between a terminal for outputting the signal VGP and the ground terminal. The drain-source path of the transistor N111 is parallel-connected to that of the transistor N112, and the drain-source path of the transistor N114 is parallel-connected to that of the transistor N115. The gates of the transistors N111 to N115 respectively receive the enable signals /EN1 to /EN5.

The transistor N3 functions to ground one terminal of the circuit 22 when the power supply voltage vcc is supplied to the power supply terminal 10. The transistor P3 functions to output the potential of the node 100 as the control signal VGP when the power supply terminal 10 is grounded.

The circuit shown in FIG. 7B is different from the circuit shown in FIG. 7A in the connection position of the transistor N3 whose two terminals are connected between the circuits 21 and 22.

In the circuit shown in FIG. 7C, the circuit 22 is divided into a circuit 23 having transistors N111 and N112 and a circuit 24 having transistors N113, N114, and N115, and the drain and source of the transistor N3 are respectively connected to one terminal of the circuit 23 and one terminal of the circuit 24.

Figure 8:
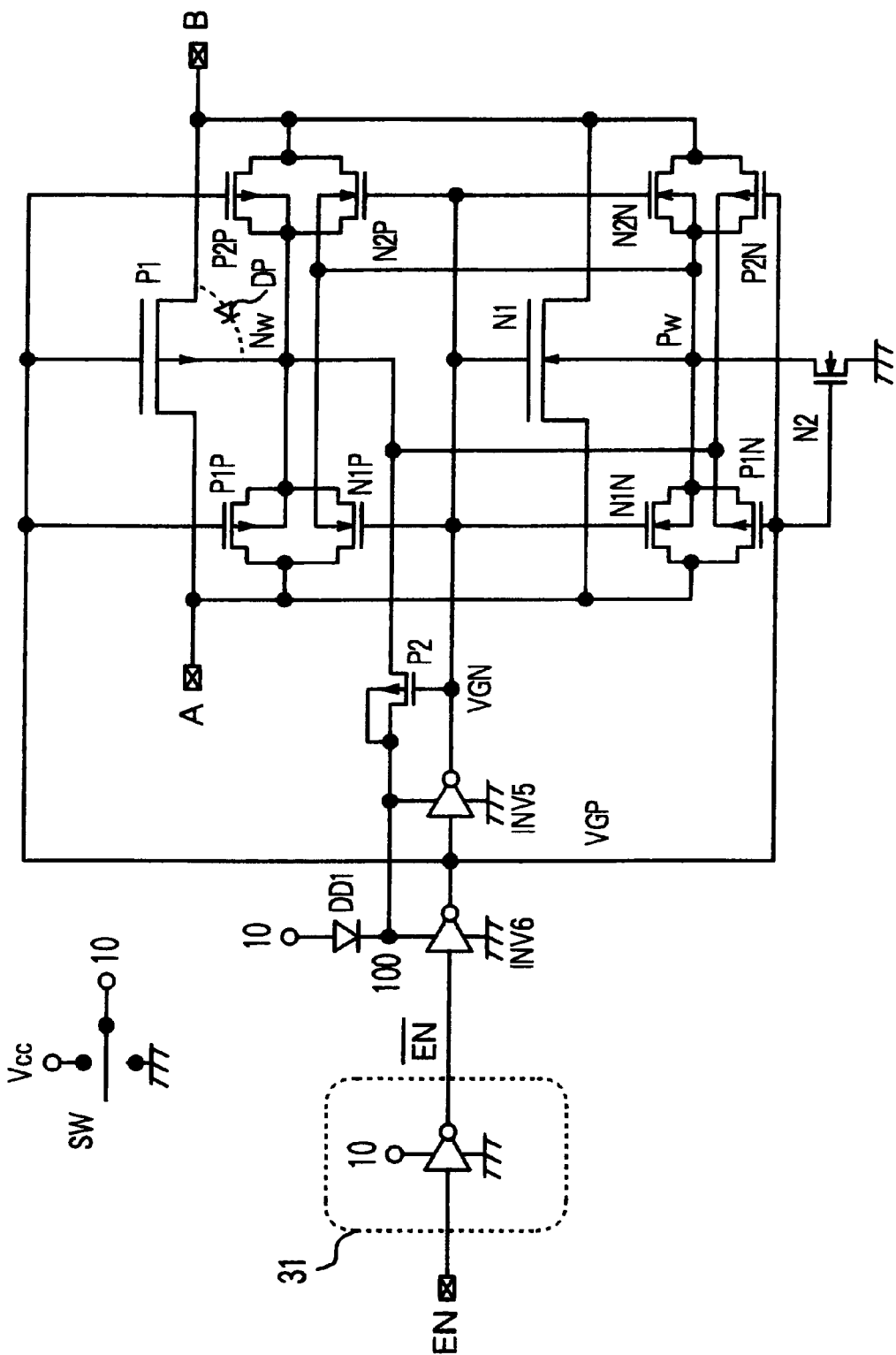
FIG. 8 is a circuit diagram showing the arrangement of a transmission gate circuit according to the fifth embodiment of the present invention.

The fifth embodiment will be described with reference to FIG. 8. In the first to fourth embodiments, the control signal VGP is generated using the NAND circuit NA1 or logic circuit LC1. In these embodiments, when the power supply terminal 10 is grounded, the control signal VGP becomes equal to the potential of the node 100 regardless of the level of the enable signal, and is supplied to the gate of the transistor P1 to turn it off. As far as this control signal VGP can be generated, the circuit can be variously modified. In the fifth embodiment, the control signal VGP is generated using inverters 31 and INV6 in place of the NAND circuit NA1 or logic circuit LC1.

When the power supply voltage Vcc is supplied to the power supply terminal 10, the inverter 31 receives this voltage Vcc at the power supply terminal and operates. The inverter 31 generates an enable signal /EN obtained by inverting the enable signal EN and outputs it to the inverter INV6. In this case, the inverter INV6 operates similarly to the NAND circuit NA1 in the first and second embodiments, and this transmission gate circuit conducts or does not conduct current between the terminals A and B in accordance with the level of the enable signal /EN.

If the power supply terminal 10 is grounded, the inverter 31 outputs a ground-level signal /EN regardless of the enable signal EN, as described above. The inverter INV6 transfers the potential of the node 100 as the control signal VGP, similar to the first embodiment, and applies the potential to the gate of the transistor P1 to turn it non-conductive.

Figure 6:
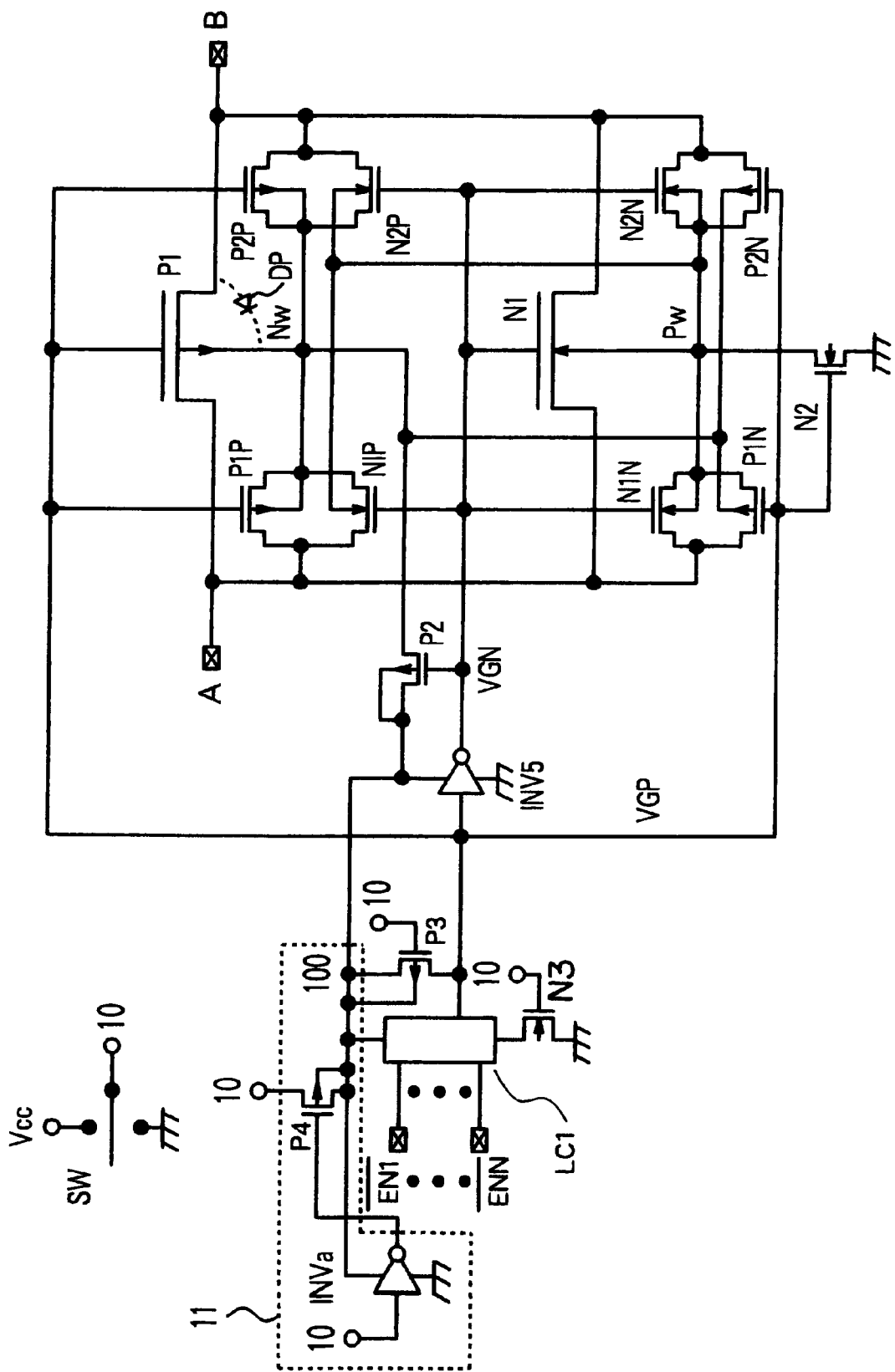
FIG. 6 is a circuit diagram showing the arrangement of a transmission gate circuit according to the fourth embodiment of the present invention.
Figure 9:
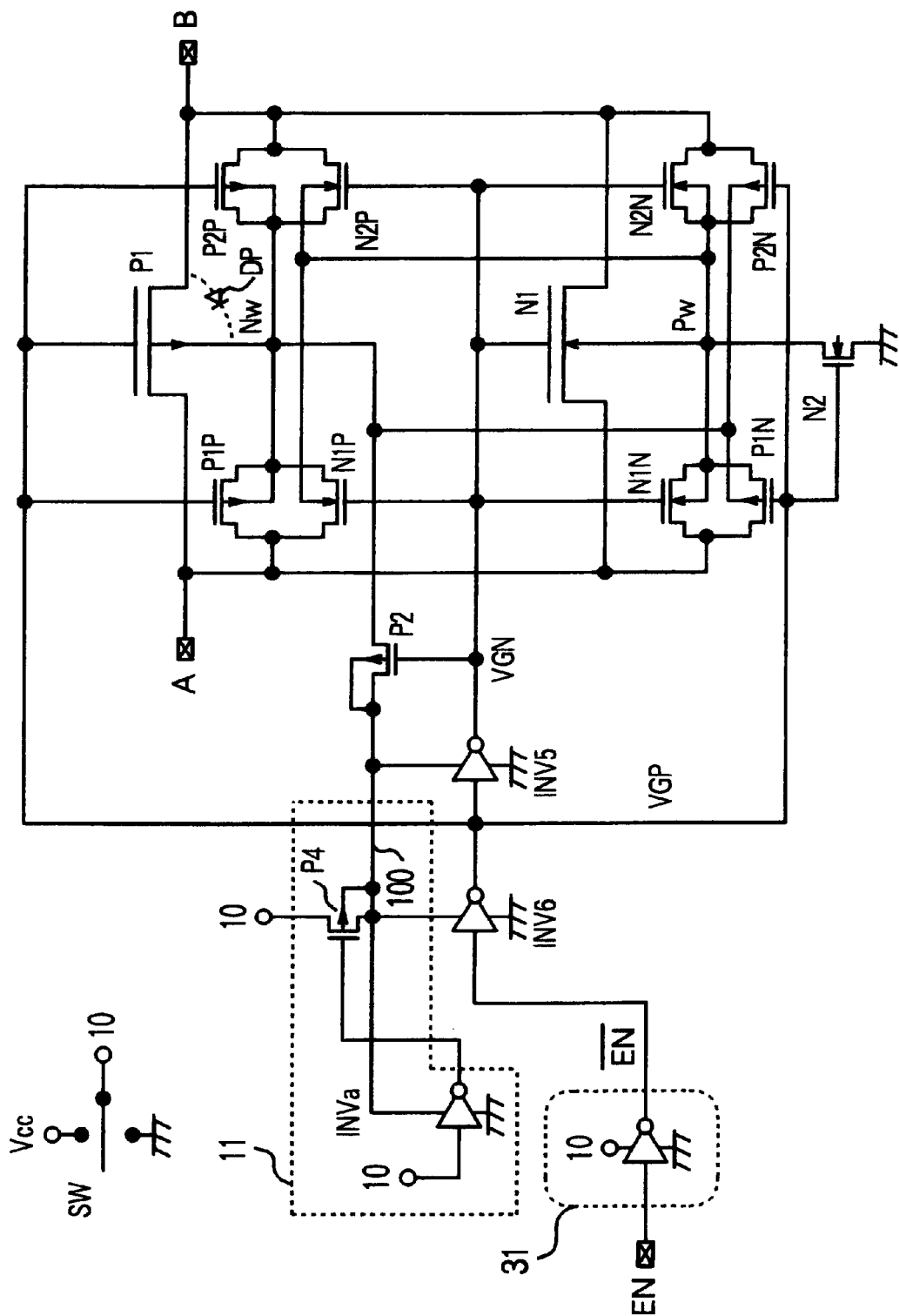
FIG. 9 is a circuit diagram showing the arrangement of a transmission gate circuit according to the sixth embodiment of the present invention.

In the sixth embodiment shown in FIG. 9, the circuit 11 in the third embodiment shown in FIG. 6 replaces the diode DD1 in the fifth embodiment. By using the circuit 11, when the power supply voltage Vcc is supplied to a power supply terminal 10, both the control signals VGP and VGN can swing fully from the ground voltage Vss to the power supply voltage Vcc, similar to the fifth embodiment. The power supply terminal of an inverter INV5 is connected to a node 100 but may be directly connected to the power supply terminal 10.

Figure 10:
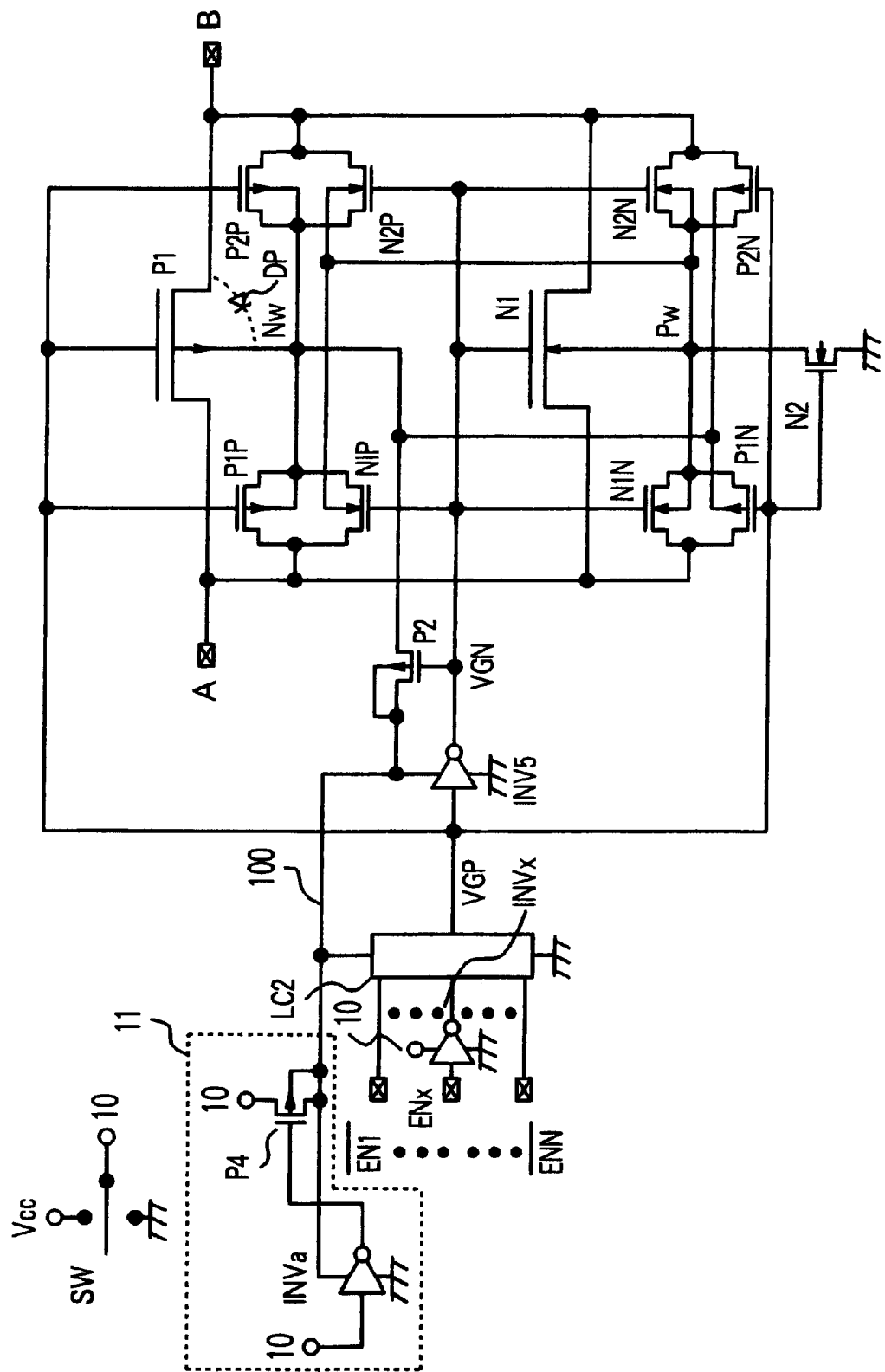
FIG. 10 is a circuit diagram showing the arrangement of a transmission gate circuit according to the seventh embodiment of the present invention.

FIG. 10 shows an arrangement according to the seventh embodiment of the present invention. The seventh embodiment is characterized by using a multi-input logic circuit LC2 instead of the inverters 31 and INV6 in the sixth embodiment. The logic circuit LC2 has a power-supply-side terminal connected to a node 100 and a ground-side terminal fixed to the ground voltage, similar to the third embodiment shown in FIG. 6. The logic circuit LC2 comprises N input terminals which receive N enable signals /EN1 to /ENN and one input terminal which receives a signal /ENx obtained by inverting another enable signal ENx by an inverter INVx. The inverter INVx has a power-supply-side terminal connected to a power supply terminal 10, similar to the inverter 31.

In the arrangement using the inverters 31 and INV6, when the power supply terminal 10 is grounded, a control signal VGP having the same potential as the node 100 is generated regardless of the level of the enable signal EN, and supplied to the gate of the transistor P1 to turn non-conductive it. Also in the seventh embodiment, when the power supply terminal 10 is grounded, the logic circuit LC2 must always generate a control signal VGP having the same potential as the node 100 regardless of the levels of the enable signals /EN1 to /ENN.

When the power supply terminal 10 is grounded, the inverter INVx outputs a ground-level potential regardless of the level of the enable signal ENx. Upon reception of this output, the current path between the output terminal VGP and ground voltage Vss terminal is cut off in the logic circuit LC2, and the voltage of the node 100 is output as the control signal VGP.

Figure 11:
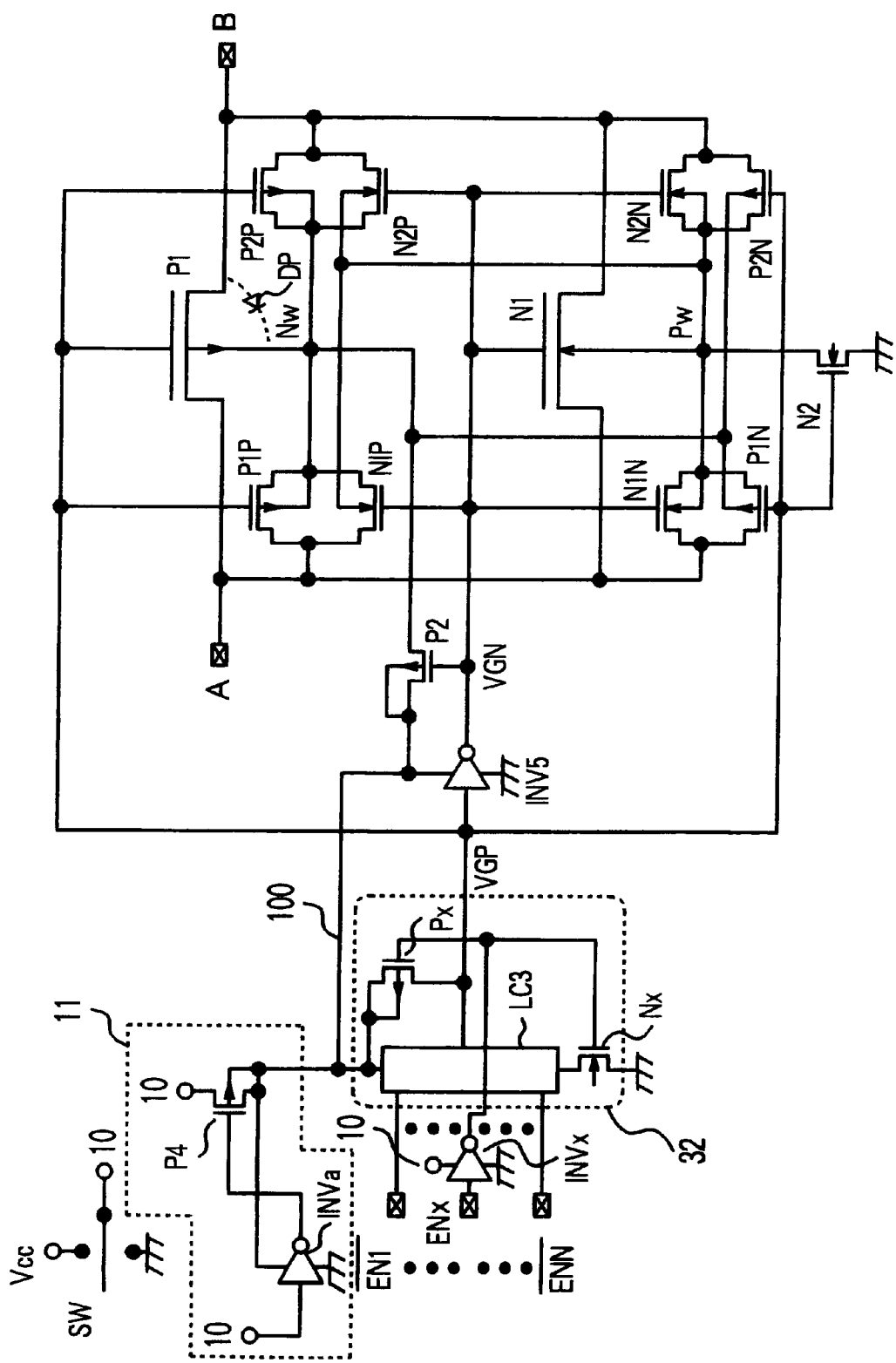
FIG. 11 is a circuit diagram showing the arrangement of a transmission gate circuit according to the eighth embodiment of the present invention.

The arrangement of the logic circuit LC2 in the seventh embodiment may be replaced with a logic circuit LC3 and p- and n-channel MOS transistors Px and Nx, like the eighth embodiment of the present invention shown in FIG. 11. Similar to the seventh embodiment, when a power supply terminal 10 is grounded, the transistor Nx is turned non-conductive regardless of the level of the enable signal ENx to cut off the current path between the logic circuit LC3 and ground terminal, and the transistor Px outputs the potential of a node 100 as the control signal VGP.

Figure 12B:
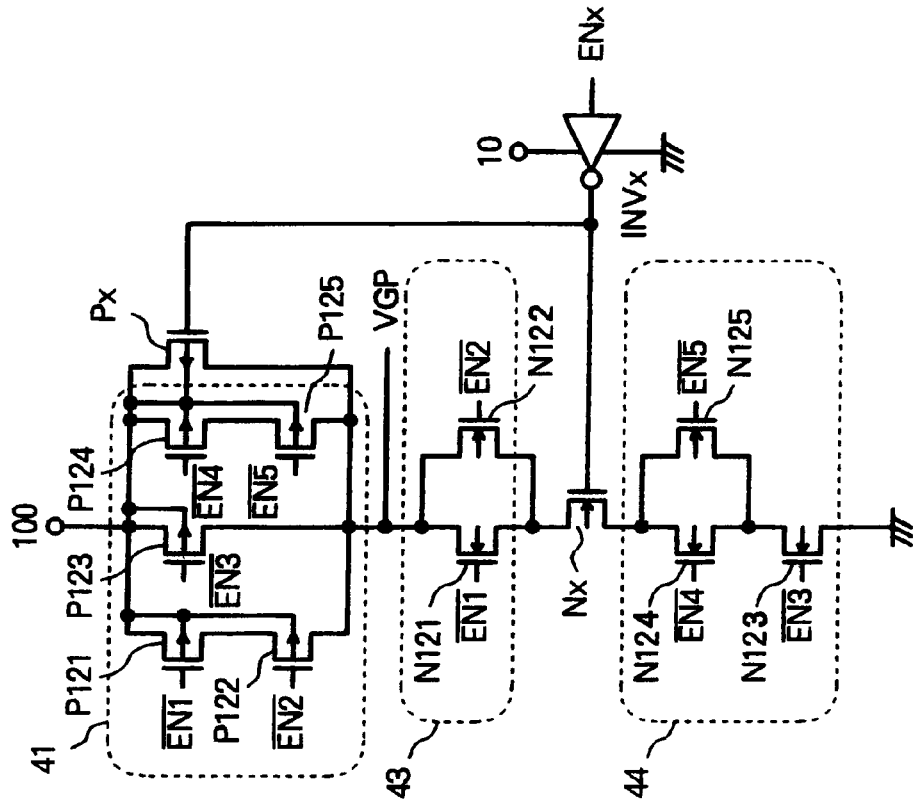
FIGS. 12A and 12B are circuit diagrams each showing the detailed arrangement of a logic circuit in the transmission gate circuit.
Figure 12A:
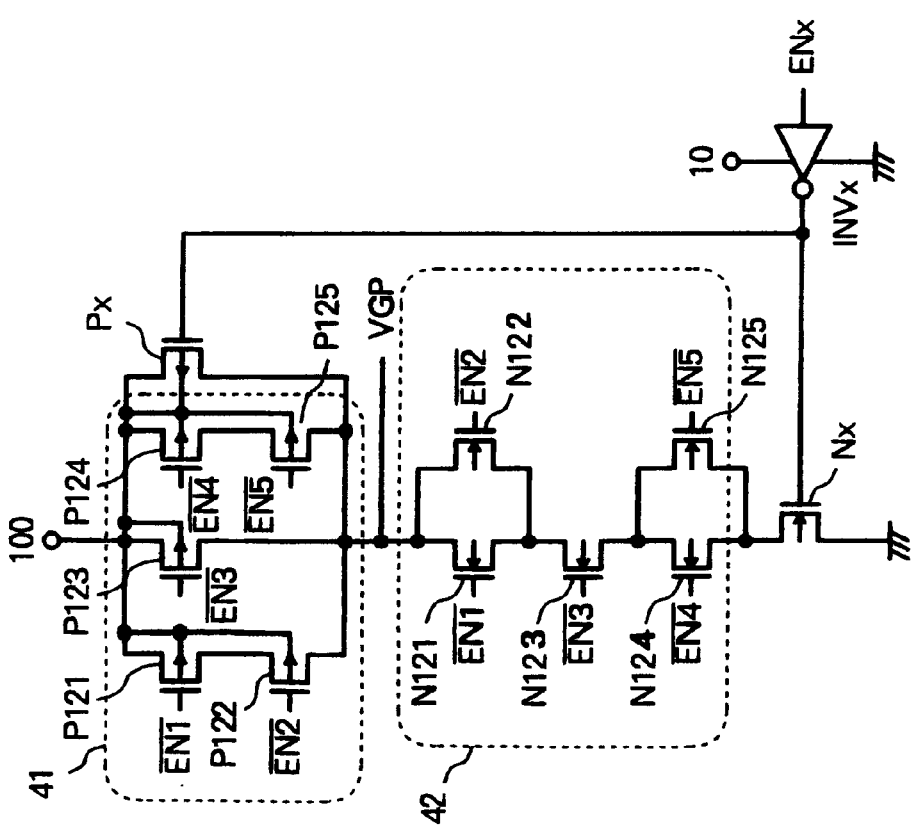
Figure 13:
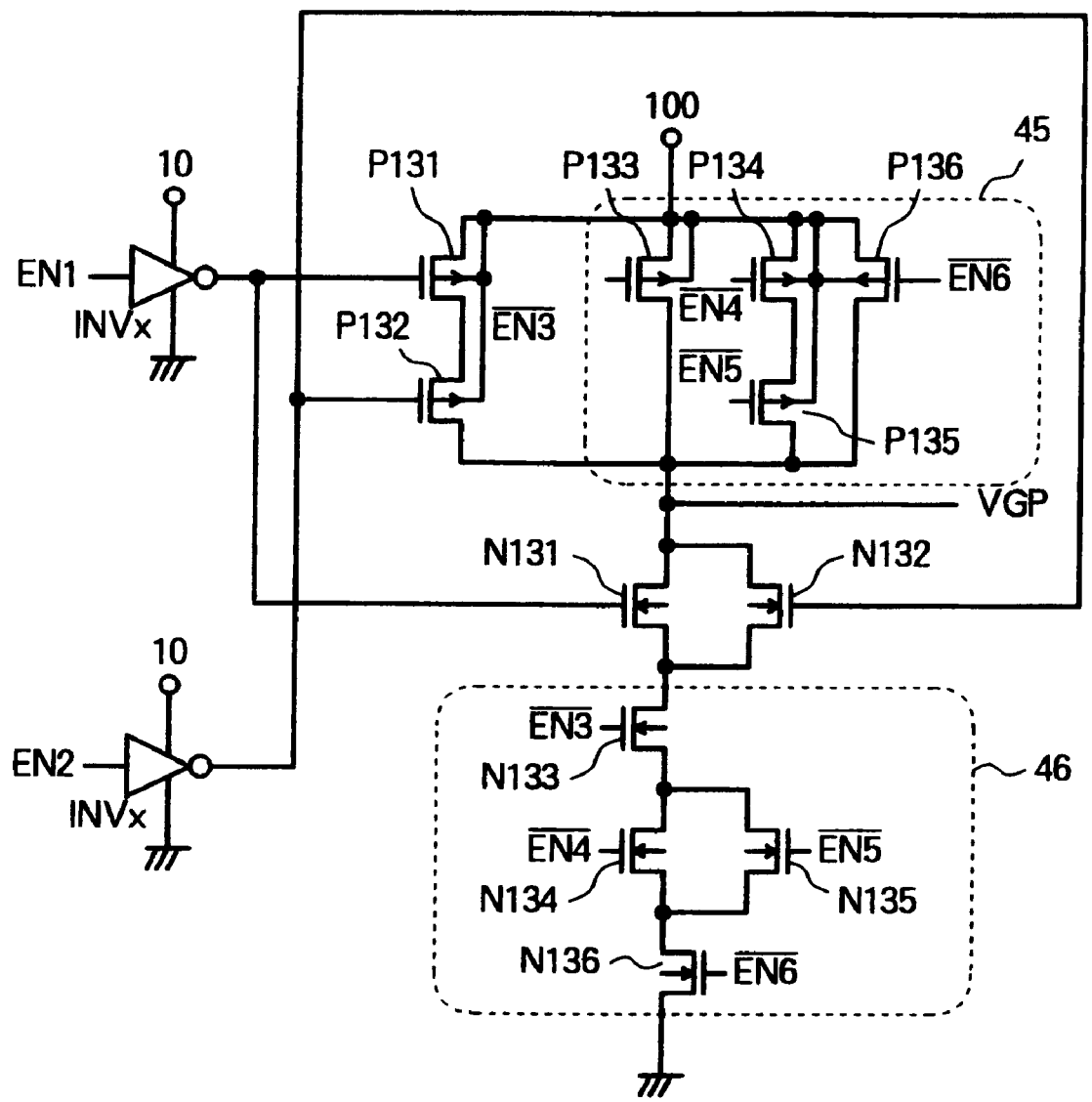
FIG. 13 is a circuit diagram showing the detailed arrangement of the logic circuit in the transmission gate circuit.

FIGS. 12A, 12B, and 13 show examples of the detailed arrangement of a circuit 32 including the logic circuit LC3 and transistors Px and Nx. In the circuit shown in FIG. 12A, circuits 41 and 42 and the drain-source path of the n-channel MOS transistor Nx are series-connected between the power supply terminal 100 and ground terminal. In the circuit 41, the source-drain paths of p-channel MOS transistors P121 and P122 are series-connected between the power supply terminal 100 and a node for outputting the control signal VGP. The source-drain path of a p-channel MOS transistor P123 is parallel-connected to this series circuit. A series circuit of the source-drain paths of p-channel MOS transistors P124 and P125 is parallel-connected to the transistor P123. The source-drain path of the transistor Px is parallel-connected to the circuit 41 between the power supply terminal 100 and a node for outputting the control signal VGP. The gates of the transistors P121 to P125 respectively receive the enable signals /EN1 to /EN5.

In the circuit 42, the drain-source paths of n-channel MOS transistors N121, N123, and N124 are series-connected between the output node of the control signal VGP and the ground terminal. The drain-source path of an n-channel MOS transistor N122 is parallel-connected to that of the transistor N121, and the drain-source path of an n-channel MOS transistor N125 is parallel-connected to that of the transistor N124. The gates of the transistors N121 to N125 respectively receive the enable signals /EN1 to /EN5.

The gates of the transistors Px and Nx receive an enable signal /ENx inverted by the inverter INVx.

Since the power-supply-side terminal of the inverter INVx is connected to the power supply terminal 10, the inverter INVx outputs a ground-level signal regardless of the enable signal ENx when the power supply terminal 10 is grounded. Accordingly, the transistors Px and Nx are respectively turned conductive and non-conductive regardless of operation of the circuits 41 and 42 and output the potential of the node 100 as the control signal VGP.

The circuit shown in FIG. 12B operates similarly to the circuit in FIG. 12A except that the circuit 42 in FIG. 12A is divided into a circuit 43 having transistors N121 and N122 and a circuit 44 having transistors N123, N124, and N125, and the drain-source path of the transistor Nx is connected between the circuits 43 and 44.

The circuit 32 shown in FIG. 11 or the circuit shown in FIG. 12A or 12B outputs a control signal VGP having the same potential as the node 100 using another enable signal /ENx regardless of the enable signals /EN1 to /EN5 when the power supply terminal 10 is grounded. However, a circuit like the one shown in FIG. 13 can also attain the same function using a plurality of enable signals /EN1 and /EN2. In this circuit, a circuit 45, transistors N131 and N132 having drain-source paths parallel-connected, and a circuit 46 are series-connected between the power supply terminal 100 and ground terminal.

In the circuit 45, the source-drain path of a transistor P133 is connected between the power supply terminal 100 and a node for outputting the control signal VGP. A series circuit of the source-drain paths of p-channel MOS transistors P134 and P135 is parallel-connected to the transistor P133. The source-drain path of a p-channel MOS transistor P136 is parallel-connected to this series circuit. The gates of the transistors P131 to P136 respectively receive the enable signals /EN1 to /EN6. A series circuit of the source-drain paths of p-channel MOS transistors P131 and P132 is parallel-connected to the source-drain path of the transistor P133.

In the circuit 46, the drain-source paths of n-channel MOS transistors N133, N134, and N135 are series-connected between the sources of the transistors N131 and N132 and the ground terminal. The drain-source path of the transistor N135 is parallel-connected to that of a transistor N134. The gates of the transistors P133 to P136 and N133 to N136 respectively receive the enable signals /EN3 to /EN6. The gates of the transistors P131 and P132 respectively receive the enable signals /EN1 and /EN2 inverted by inverters INVx1 and INVx2. Similarly, the gates of the transistors N131 and N132 respectively receive the enable signals /EN1 and /EN2.

When the power supply terminal 10 is grounded, the inverters INVx1 and INVx2 output ground-level enable signals /EN1 and /EN2 regardless of the enable signals /EN3 to /EN6 to turn conductive the transistors P131 and P132 and turn non-conductive the transistors N131 and N132, and the potential of the node 100 is output as the control signal VGP.

Figure 14:
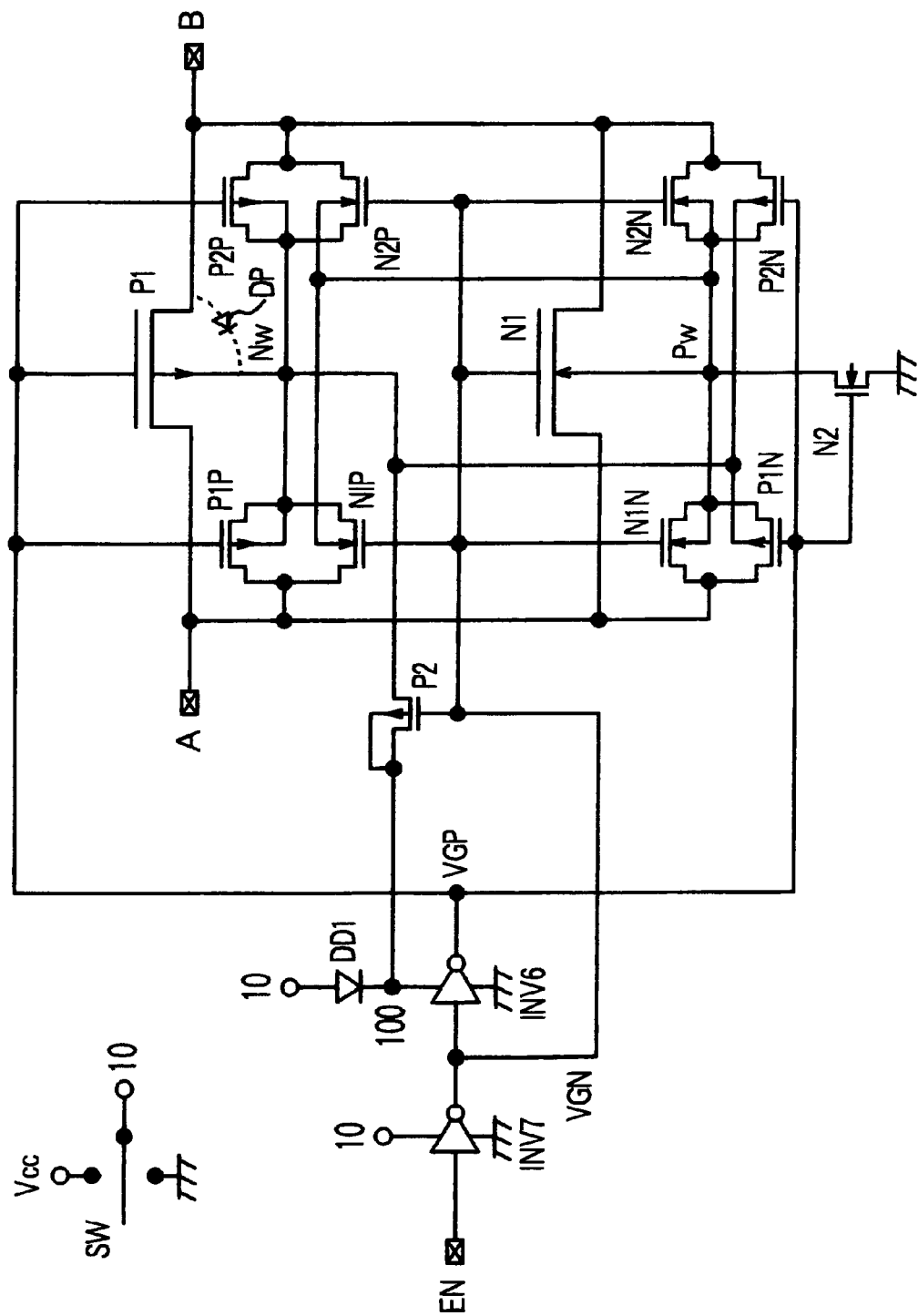
FIG. 14 is a circuit diagram showing the arrangement of a transmission gate circuit according to the ninth embodiment of the present invention.

The ninth embodiment of the present invention will be explained with reference to FIG. 14. In the first to third embodiments, the enable signal /EN is input to one input terminal of the 2-input NAND circuit NA1, and the other input terminal is connected to the power supply terminal 10. With this arrangement, when the power supply terminal 10 is grounded, an output VGP having the same potential as the node 100 is obtained regardless of the level of the enable signal /EN.

To the contrary, the ninth embodiment employs inverters INV6 and INV7 in place of the NAND circuit NA1 and inverter INV5. When the power supply terminal 10 is grounded, a control signal VGP having the same potential as the node 100 and a ground-level control signal VGN are generated regardless of the enable signal /EN.

The inverter INV7 has a power-supply-side terminal connected to the power supply terminal 10 and a ground-side terminal grounded, and receives the enable signal EN at the input terminal to output the control signal VGN. The inverter INV6 has a power-supply-side terminal connected to the cathode side of a diode DD1 having an anode connected to the power supply terminal 10 and a cathode connected to the node 100, and a ground-side terminal grounded. The INV6 outputs the control signal VGP.

When the power supply voltage Vcc is supplied to the power supply terminal 10, the inverter INV7 operates and generates a control signal VGN of a level obtained by inverting the enable signal EN, thereby controlling the conductive/non-conductive state of transistors P2, N1, N1P, N2P, N1N, and N2N. Further, the inverter INV6 operates upon reception a voltage of Vcc-Vf level, and generates and outputs a control signal VGP of a level obtained by inverting the control signal VGN. This signal VGP is input to the gates of transistors N2, P1, P1P, P2P, P1N, and P2N to control their operation. Hence, both the transistors P1 and N1 are turned conductive/non-conductive in accordance with the enable signal EN, and the remaining transistors P2, N2, N1P, N2P, N1N, N2N, P1P, P2P, P1N, and P2N compensate for the body effect.

When the power supply terminal 10 is grounded, the inverter INV7 outputs a control signal VGN of ground voltage level regardless of the enable signal EN to turn non-conductive all the transistors N1, N1P, N2P, N1N, and N2N. The inverter INV6 outputs a control signal VGP having the same potential as the node 100 to turn non-conductive the transistors P1, P1P, P2P, P1N, and P2N. Consequently, no current path forms between the terminals A and B and no current path forms from the terminals A and B to the ground potential to prevent wasteful current consumption.

Figure 15:
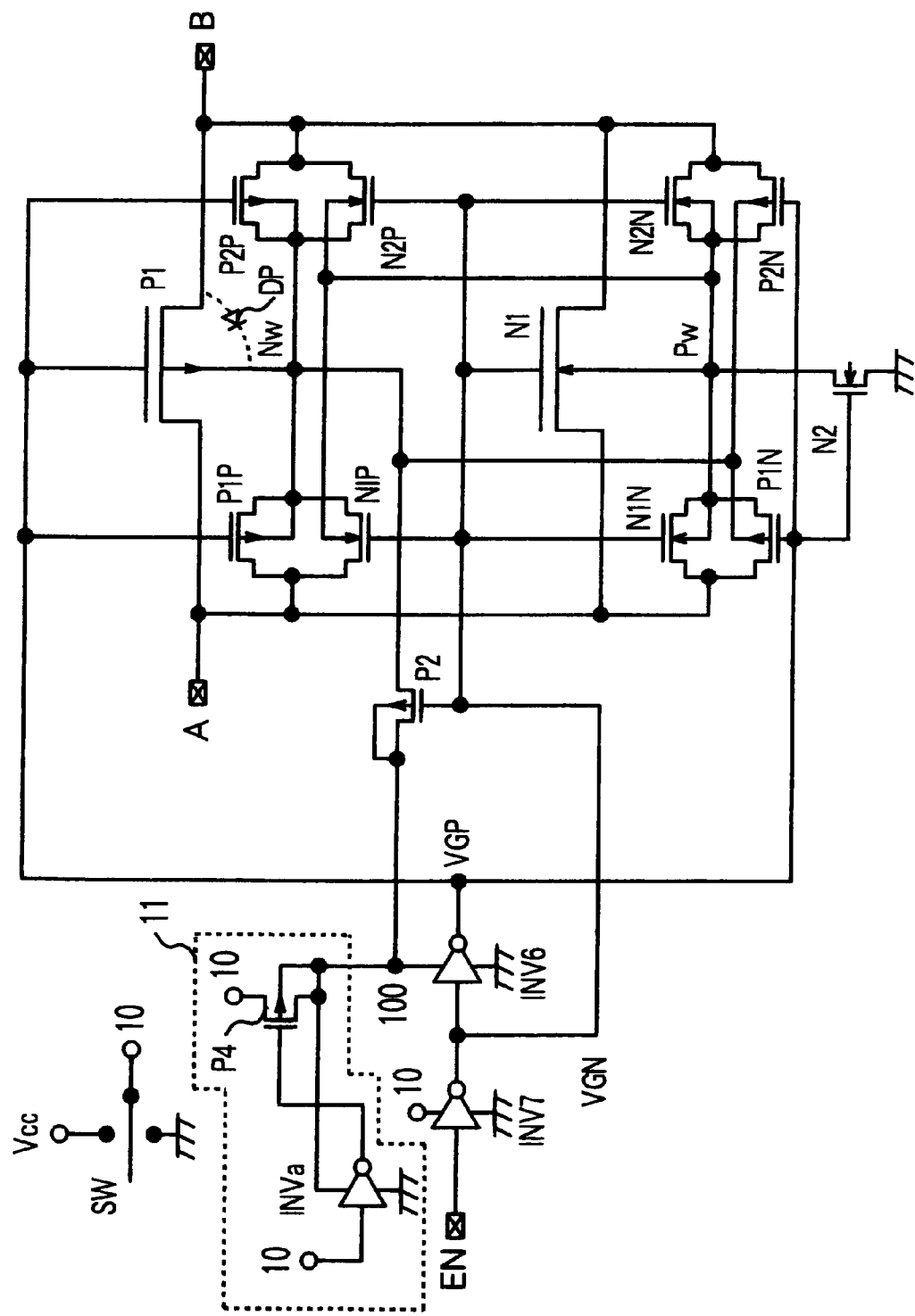
FIG. 15 is a circuit diagram showing the arrangement of a transmission gate circuit according to the 10th embodiment of the present invention.

FIG. 15 shows the arrangement of the 10th embodiment using the circuit 11 shown in FIG. 3F instead of the diode DD1 in the ninth embodiment. When the power supply voltage Vcc is supplied to a power supply terminal 10, a voltage equal to the power supply voltage Vcc is output to a node 100 via the drain of a transistor P4, as described above. Thus, when the control signals VGN and VGP change to high level, a Vcc-level signal can be output without any voltage drop.

Figure 16:
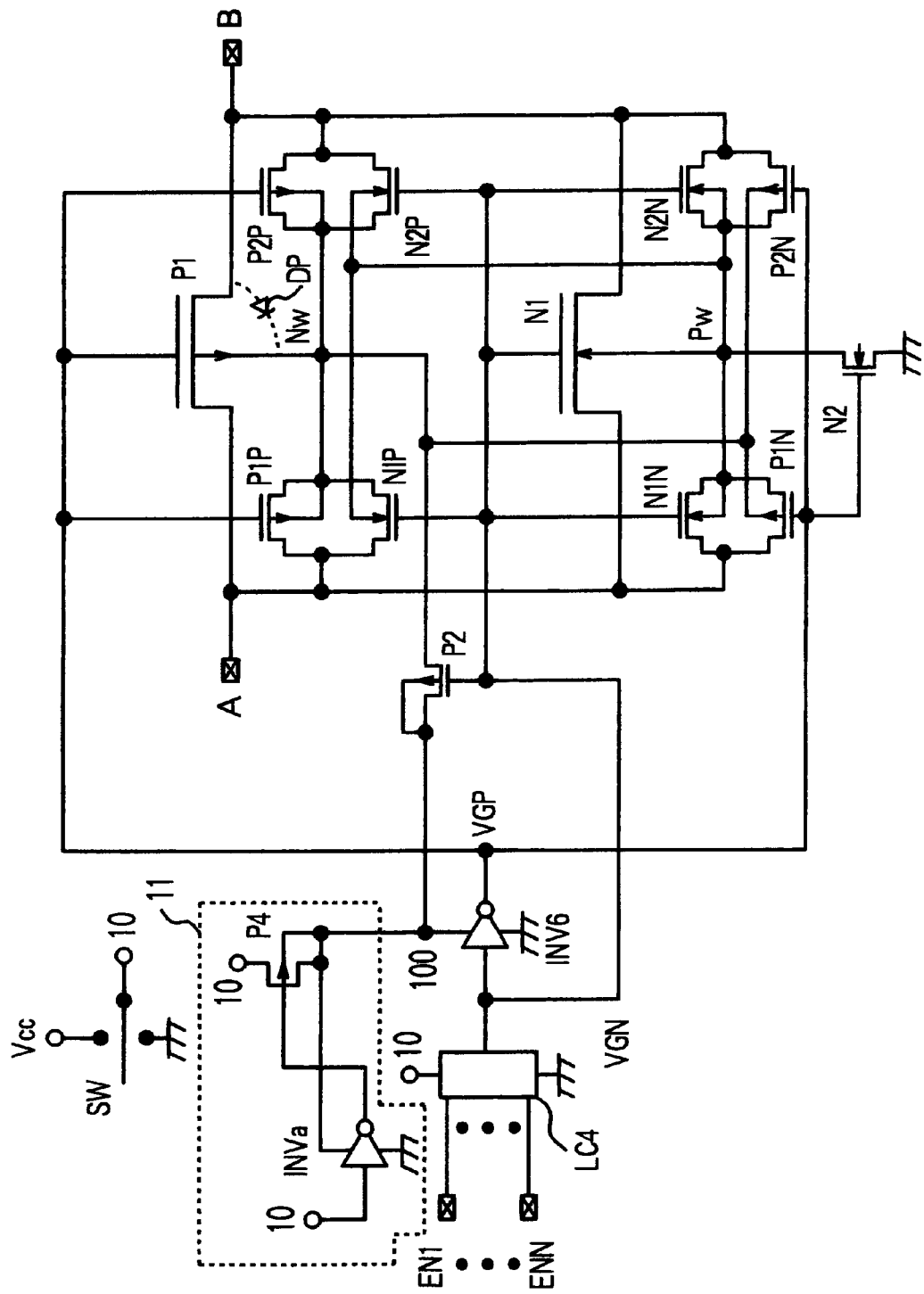
FIG. 16 is a circuit diagram showing the arrangement of a transmission gate circuit according to the 11th embodiment of the present invention.

The 11th embodiment of the present invention is different from the 10th embodiment by using a multi-input logic circuit LC4 in place of the inverter INV7 in the 10th embodiment, and the arrangement of the 11th embodiment is shown in FIG. 16. Similar to the 10th embodiment, when the power supply voltage Vcc is supplied to a power supply terminal 10, a control signal VGN corresponding to the levels of enable signals EN1 to ENN and a control VGP as an inverted signal of the control signal VGN are generated. When the power supply terminal 10 is grounded, a logic circuit LC4 outputs a control signal VGN of ground voltage level regardless of the levels of the enable signals EN1 to ENN. Further, if a signal of power supply voltage Vcc level is applied to an output terminal B, a voltage of Vcc-Vf level is applied to a node 100 via the source of a transistor P1, a back gate Nw, and a transistor P2. An inverter INV6 inputs a control signal VGP of Vcc-Vf level to the gate of the transistor P1 to turn non-conductive the transistor P1 and cut off a path of any wasteful current.

Figure 17:
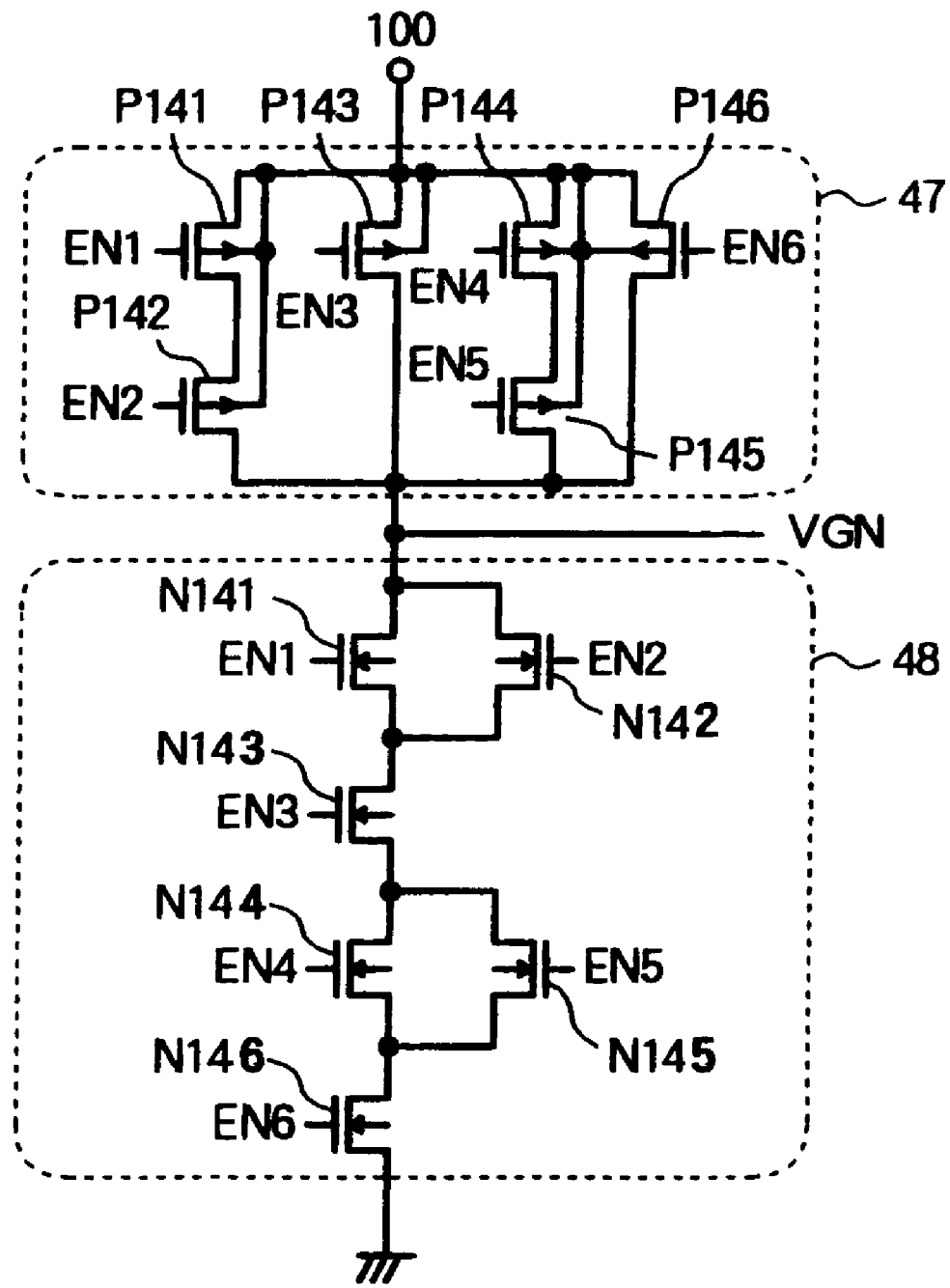
FIG. 17 is a circuit diagram showing the detailed arrangement of a logic circuit in the transmission gate circuit.

FIG. 17 shows an example of the detailed arrangement of the logic circuit LC4. Circuits 47 and 48 are series-connected between the power supply terminal 10 and ground terminal. In the circuit 47, the source-drain paths of p-channel MOS transistors P141 and P142 are series-connected between the terminal 10 and a node for outputting the control signal VGN. A p-channel MOS transistor P143 is parallel-connected to this series circuit. A series circuit of the source-drain paths of p-channel MOS transistors P144 and P145 is parallel-connected to the transistor P143. A p-channel MOS transistor P146 is parallel-connected to the transistors P144 and P145.

In the circuit 48, the drain-source paths of n-channel MOS transistors N141, N143, N144, and N146 are series-connected between a node for outputting the control signal VGN and the ground terminal. The drain-source path of the transistor N142 is parallel-connected to that of a transistor N141, and the drain-source path of the transistor N145 is parallel-connected to that of a transistor N144. The gates of the transistors P141 to P146 and N141 to N146 respectively receive the enable signals EN1 to EN6. Even with the logic circuit LC4 having this arrangement, a desired operation can be achieved.

In the first to 11th embodiments, the transmission gate circuit is constituted as an analog switch using the p- and n-channel MOS transistors P1 and N1, and thus the body effect compensation circuit is constructed from the p- and n-channel MOS transistors.

Figure 18:
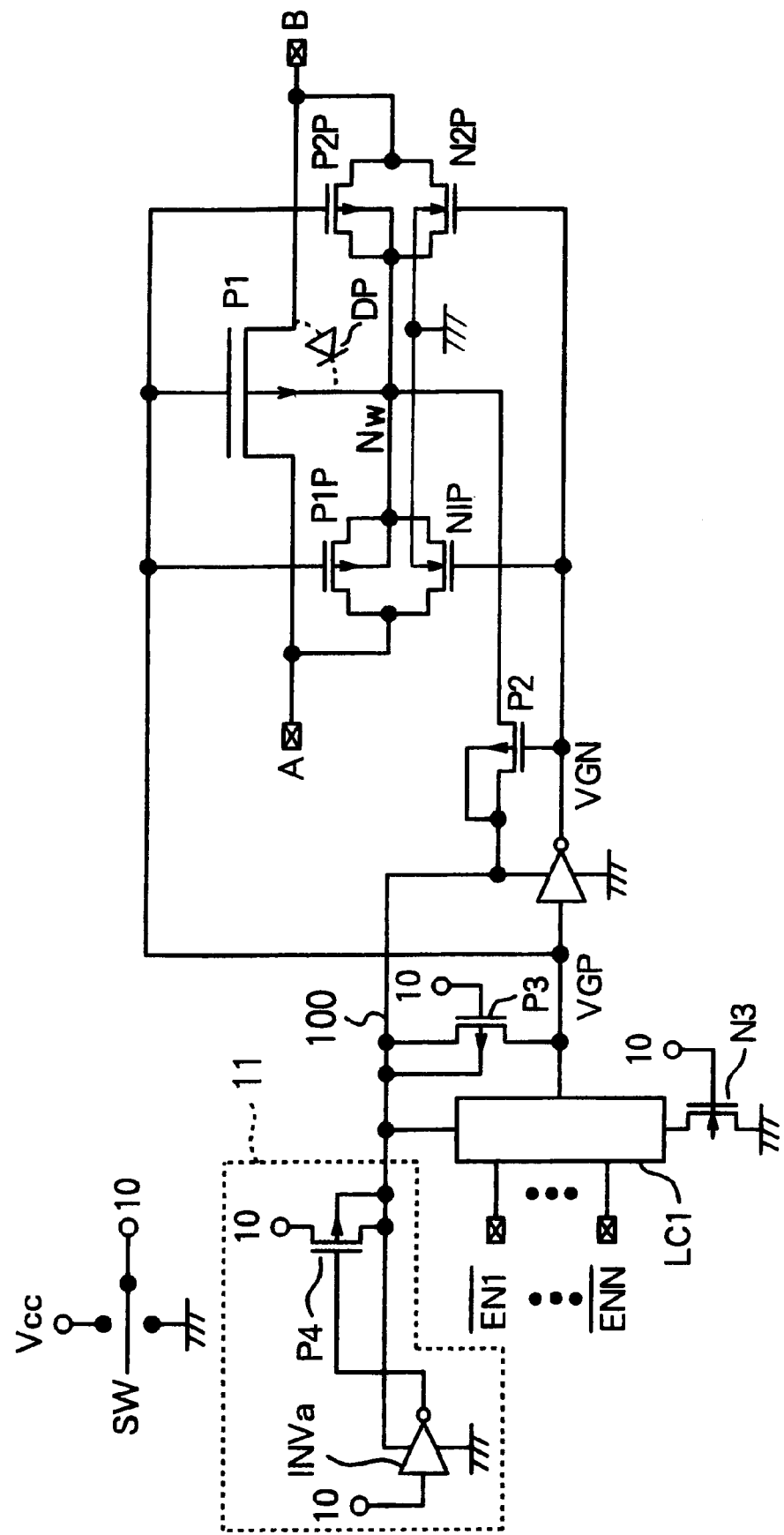
FIG. 18 is a circuit diagram showing the arrangement of a transmission gate circuit according to the 12th embodiment of the present invention.

Alternatively, the n-channel MOS transistor N1 and the body effect compensation circuit for this transistor N1 may be eliminated like the following 12th to 14th embodiments. The 12th embodiment eliminates the n-channel MOS transistors N1, N1N, N2N, P1N, P2N, and N2 in the fourth embodiment shown in FIG. 6, and the arrangement of the 12th embodiment is shown in FIG. 18. In the 12th embodiment as well as the first to 11th embodiments, when the power supply voltage Vcc is supplied to a power supply terminal 10, control signals VGP and VGN corresponding to enable signals /EN1 to /ENN are generated to control the conductive/non-conductive state of a transistor P1.

When the power supply terminal 10 is grounded, transistors P3 and N3 are respectively turned conductive and non-conductive regardless of the enable signal, and a control signal VGP equal in voltage to a node 100 is output from the output terminal of a logic circuit LC1. This signal VGP is applied to the gate of the transistor P1 to turn non-conductive the transistor P1 and disable a path from a terminal B to a back gate Nw.

Figure 19:
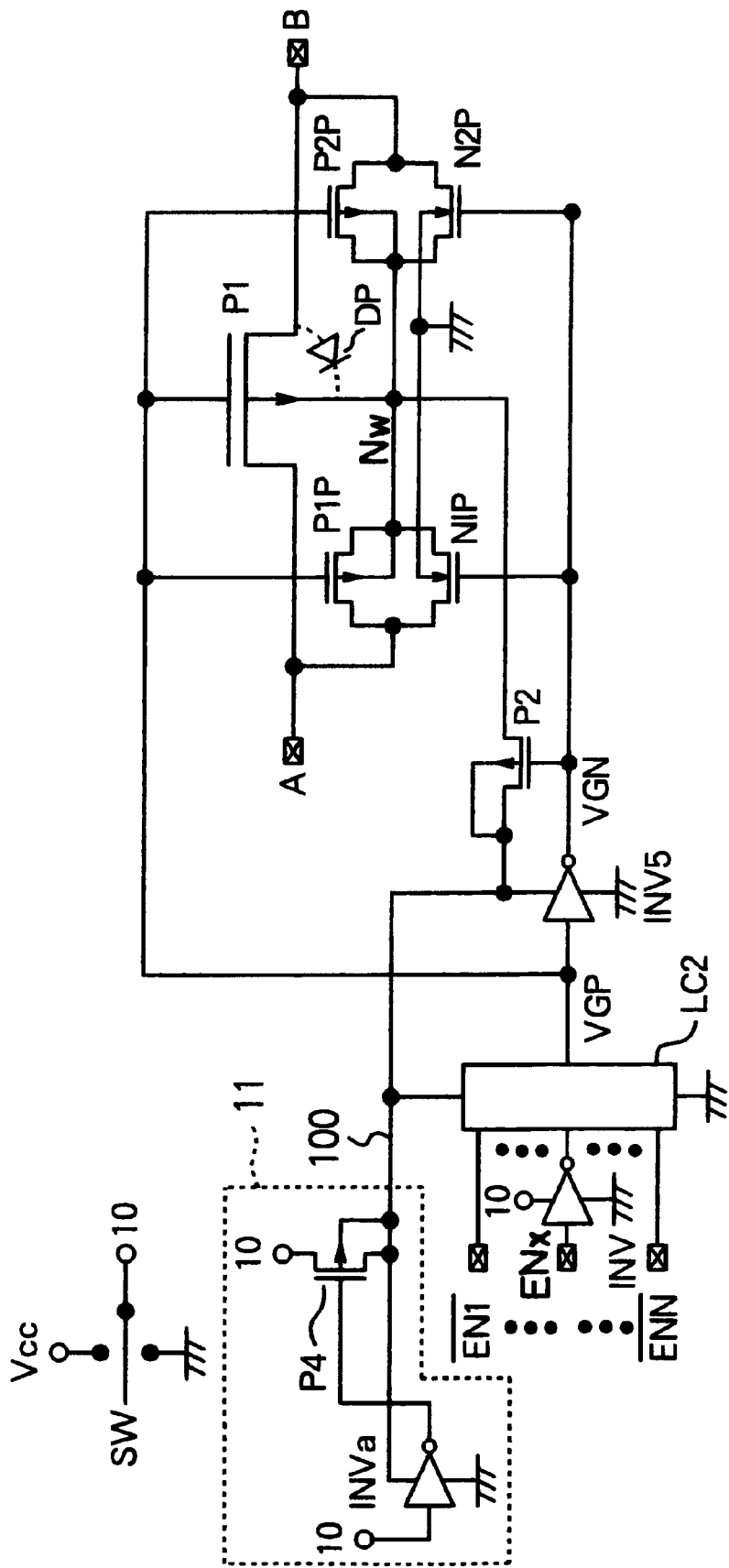
FIG. 19 is a circuit diagram showing the arrangement of a transmission gate circuit according to the 13th embodiment of the present invention.

The 13th embodiment of the present invention has an arrangement shown in FIG. 19 in which the n-channel MOS transistors N1, N1N, N2N, P1N, P2N, and N2 in the seventh embodiment shown in FIG. 10 are eliminated.

Figure 20:
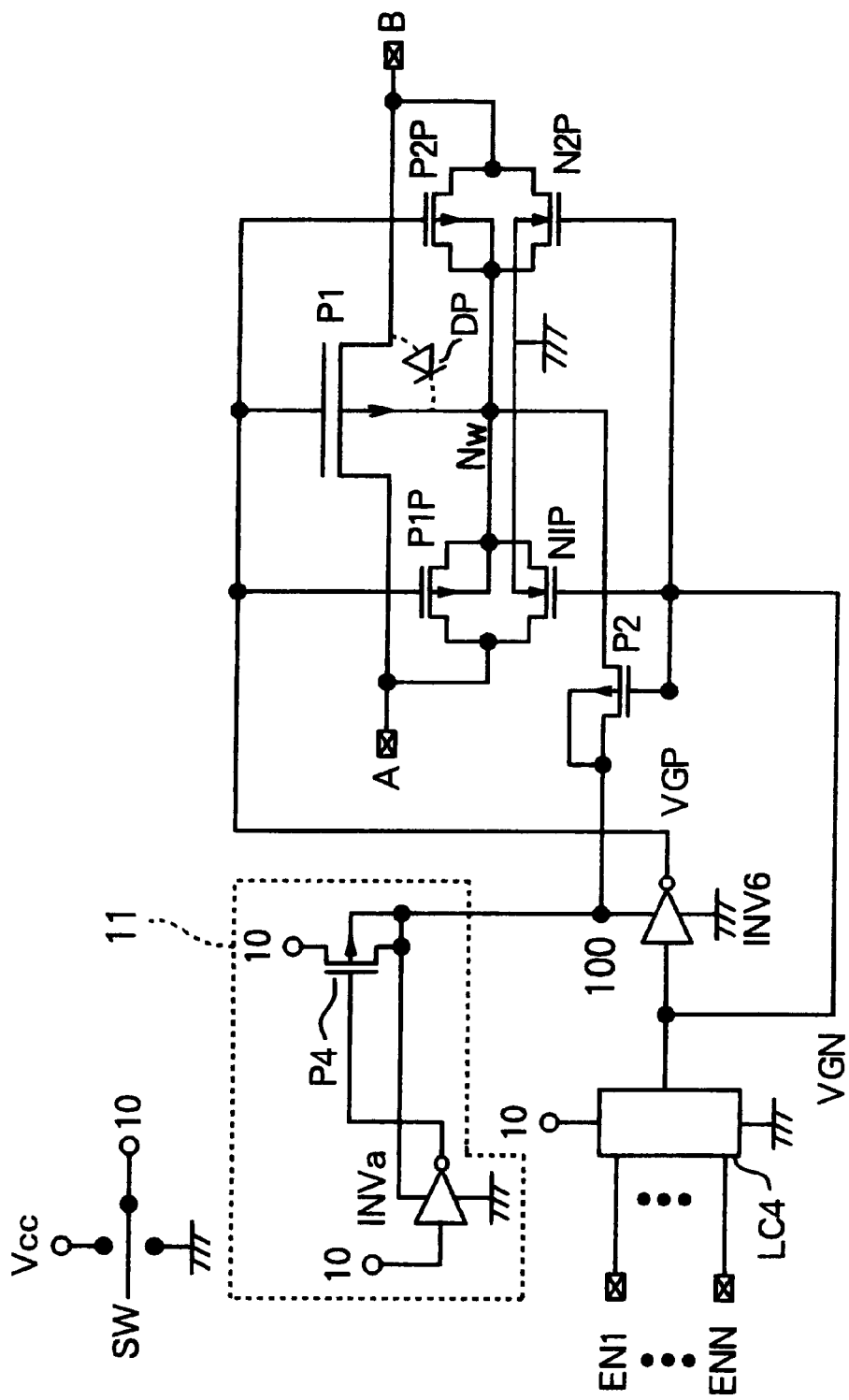
FIG. 20 is a circuit diagram showing the arrangement of a transmission gate circuit according to the 14th embodiment of the present invention.

The 14th embodiment of the present invention has an arrangement shown in FIG. 20 in which the n-channel MOS transistors N1, N1N, N2N, P1N, P2N, and N2 in the 11th embodiment shown in FIG. 16 are eliminated. In both the 13th and 14th embodiments, when a power supply terminal 10 is grounded, a control signal VGP equal in potential to a node 100 is generated regardless of the enable signal and applied to the gate of a transistor P1 to turn non-conductive the transistor P1 and disable the current path.

The above-described embodiments are merely examples and do not limit the present invention. For example, all the embodiments cope with a bi-directional analog switch circuit in which a signal is transferred from the terminal A to the terminal B and from the terminal B to the terminal A. If, however, these embodiments are applied to a uni-directional analog switch used only when a signal is transferred, e.g., from the terminal A to the terminal B, the transistors P2P and N2P in the body effect compensation circuit for the transistor P1 and the transistors P2N and N2N in the body effect compensation circuit for the transistor N1 can be eliminated.

The above embodiments adopt the switch SW for switching the power supply terminal 10 between the power supply voltage Vcc terminal and ground terminal. In addition to this, the present invention is also effective for a switch for switching the power supply terminal 10 between the power supply voltage Vcc terminal and open terminal. This is because when the power supply terminal 10 is connected to an open terminal, no charge/discharge current path forms from the terminal A or B to the power supply terminal 10, and the potential of the power supply terminal 10 can be regarded to become equal to the ground potential once the charges of the capacitance load are removed. As mentioned above, since using the switch Sw for switching the power supply terminal 10 between the power supply voltage Vcc terminal and ground terminal shortens the time required to remove charges, the standby time required to enable applying a high-level potential to the terminal A or B after the switch is switched can be greatly shortened to exhibit the effect of the present invention within a short time.

What is claimed is:

1. A transmission gate circuit, comprising:
   a switch configured to switch between a power supply voltage, a ground potential and an open terminal potential to a power supply terminal of the transmission gate circuit;
   a first p-channel MOS transistor having first and second terminals respectively connected between input and output terminals of the transmission gate circuit, and having a gate configured to receive a first control signal;
   a second p-channel MOS transistor having first and second terminals respectively connected to a source and back gate of said first p-channel MOS transistor, and configured to receive the first control signal at a gate thereof for short-circuiting the source and back gate of the first p-channel MOS transistor when the power supply voltage is supplied to the power supply terminal and said first p-channel MOS transistor is turned conductive; and
   a third p-channel MOS transistor configured to connect the power supply terminal via a first node and having one terminal connected to the back gate of said first p-channel MOS transistor, the other terminal and back gate connected to the first node, and a gate configured to receive a second control signal to connect the back gate of said first p-channel MOS transistor to the power supply terminal when the power supply voltage is supplied to the power supply terminal and said first transistor is turned non-conductive;
   a diode having a cathode connected to the first node and an anode connected to the power supply terminal;
   a first control circuit connected to the first node, and configured to receive a third control signal and to output a potential of one of 1) the first node and 2) the ground potential as the first control signal in accordance with a switching state of said switch; and
   a second control circuit connected to one of 1) the first node and 2) the power supply terminal, and configured to output one of 1) the potential of the first node or the potential of the power supply terminal and 2) the ground potential, as the second control signal in accordance with the first control signal.

2. A circuit according to claim 1, wherein:
   when the power supply voltage is supplied to the power supply terminal by said switch, said first control circuit outputs the potential of one of 1) the first node and 2) the ground potential as the first control signal in accordance with the third control signal to conductive/nonconductive-control said first and second p-channel MOS transistors, and
   when the power supply voltage is supplied to the power supply terminal by said switch, said second control circuit outputs one of 1) the potential of the first node or the potential of the power supply terminal and 2) the ground potential as the second control signal in accordance with the first control signal to conductive/non-conductive-control said third p-channel MOS transistor, and
   when the ground potential or the open terminal potential is supplied to the power supply terminal by said switch, said third p-channel MOS transistor turns conductive to set the back gate of said first p-channel MOS transistor, the first node, and the first control signal to the same potential, the gates of said first and second p-channel MOS transistors are supplied with the potential, and said first and second p-channel MOS transistors are turned non-conductive.

3. A circuit according to claim 1,
   wherein said first control circuit comprises:
      a first logic gate having a first input terminal configured to receive the third control signal, having a second input terminal configured to receive one of 1) the power supply voltage, 2) the ground potential and 3) the open terminal potential via said switch, and having a power supply terminal connected to the first node, and configured to supply an output to the gates of said first and second p-channel MOS transistors, and
      when said switch is switched to the ground potential or the open terminal potential, the potential of the back gate of said first p-channel MOS transistor is supplied to the output of said first logic gate via said third p-channel MOS transistor and the first node, and
   wherein said second control circuit comprises:
      a second logic gate having an input terminal configured to receive the output from said first logic gate, having a power supply terminal connected to one of 1) the first node and 2) the power supply terminal, and configured to supply an output to the gate of said third p-channel MOS transistor, and
      when said switch is switched to the ground potential or the open terminal potential, the ground potential or the open terminal potential is supplied to the output of said second control circuit.

4. A circuit according to claim 3, wherein said first control circuit is a NAND gate, and said second control circuit is an inverter.

5. A circuit according to claim 1, wherein said first control circuit comprises:
   a first logic circuit having a plurality of input terminals configured to respectively receive a plurality of control signals, having a power supply terminal connected to the first node, and configured to supply an output to the gates of said first and second p-channel MOS transistors;
   a fourth p-channel MOS transistor having a first terminal connected to the first node, a second terminal connected to the output of said first logic circuit, and a gate connected to one of 1) the power supply voltage, 2) the ground potential and 3) the open terminal potential via said switch, and when said switch is switched to the ground potential or the open terminal potential, the potential of the back gate of said first transistor transferred to the first node via said third p-channel MOS transistor is transferred to the output of said first logic circuit; and
   a first n-channel MOS transistor connected between the ground potential and the output of said first logic circuit, and having a gate connected to one of 1) the power supply voltage, 2) the ground potential and 3) the open terminal potential via said switch, and when said switch is switched to the ground potential or the open terminal potential, the ground potential and the output are isolated.

6. A circuit according to claim 2,
   wherein said first control circuit comprises:
      a first logic gate having a first input terminal configured to receive the third control signal, having a second input terminal configured to receive one of 1) the power supply voltage, 2) the ground potential and 3) the open terminal potential via said switch, and a power supply terminal connected to the first node, and configured to supply an output to the gates of said first and second p-channel MOS transistors, and when said switch is switched to the ground potential or the open terminal potential, the potential of the back gate of said first p-channel MOS transistor is supplied to the output of said first logic gate via said third p-channel MOS transistor and the first node, and wherein said second control circuit comprises:
a second logic gate having an input terminal configured to receive the output from said first logic gate, having a power supply terminal connected to one of 1) the first node and 2) the power supply terminal, and configured to supply an output to the gate of said third p-channel MOS transistor, and when said switch is switched to the ground potential or the open terminal potential, the ground potential or the open terminal potential is supplied to the output of said second control circuit.

7. A circuit according to claim 2, wherein said first control circuit comprises:
a first logic circuit having a plurality of input terminals configured to respectively receive a plurality of control signals, having a power supply terminal connected to the first node, and configured to supply an output to the gates of said first and second p-channel MOS transistors;

a fourth p-channel MOS transistor having a first terminal connected to the first node, having a second terminal connected to the output of said first logic circuit, and having a gate connected to one of 1) the power supply voltage, 2) the ground potential and 3) the open terminal potential via said switch, and when said switch is switched to the ground potential or the open terminal potential, the potential of the back gate of said first transistor transferred to the first node via said third p-channel MOS transistor is transferred to the output of said first logic circuit, and a first n-channel MOS transistor connected between the ground potential and the output of said first logic circuit, and having a gate connected to one of 1) the power supply potential, 2) the ground potential and 3) the open terminal potential via said switch, and when said switch is switched to the ground potential or the open terminal potential, the ground potential and the output are isolated.

8. A circuit according to claim 1, wherein said first control circuit comprises:
a first logic gate having an input terminal configured to receive the third control signal and a power supply terminal configured to receive the potential of the power supply potential via said switch, and configured to supply an output to a second logic gate; and the second logic gate having an input terminal configured to receive the output of the first logic gate and having a power supply terminal connected to the first node, and configured to supply an output to the gates of said first and second p-channel MOS transistors, and when said switch is switched to the ground potential or the open terminal potential, the potential of the back gate of said first transistor transferred to the first node via said third p-channel MOS transistor is supplied to the output of the second logic gate.

9. A circuit according to claim 8, wherein said first and second logic gates are inverters.

10. A circuit according to claim 1, wherein said first control circuit comprises:
a first logic circuit having a plurality of input terminals configured to respectively receive a plurality of control signals and having a power supply terminal connected to the first node, and configured to supply an output to the gates of said first and second p-channel MOS transistors; and an inverter having an input terminal configured to receive an arbitrary control signal, and having a power supply terminal connected to one of 1) the power supply potential and 2) the ground potential via said switch, and configured to supply an output as the arbitrary control signal to the input terminal of said first logic circuit, and when said switch is switched to the ground potential, the potential of the back gate of said first transistor transferred to the first node via said third p-channel MOS transistor is supplied to the output of the second logic circuit.

11. A circuit according to claim 1, wherein said first control circuit comprises:
a first logic circuit having a plurality of input terminals configured to respectively receive a plurality of control signals and having a power supply terminal connected to the first node, and configured to supply an output to the gates of said first and second p-channel MOS transistors;

inverter having an input terminal configured to receive an arbitrary control signal and having a power supply terminal connected to one of 1) the power supply potential and 2) the ground potential via said switch;

a fourth p-channel MOS transistor having a first terminal connected to the first node, having a second terminal connected to the output of said first logic circuit, and having a gate connected to the output of said inverter; and a fifth n-channel MOS transistor connected between the ground potential and the output of said first logic circuit, and having a gate connected to the output of said inverter, and when said switch is switched to the ground potential the potential of the back gate of said first transistor transferred to the first node via said third p-channel MOS transistor is transferred to the output of said first logic circuit, and the ground potential and the output are isolated.

12. A circuit according to claim 1, wherein said diode is a MOS transistor having a gate and one of a drain and source connected to the first node, the other one of the drain and source connected to the power supply terminal, and a back gate connected to the first node.

13. A circuit according to claim 1, wherein said diode is an npn bipolar transistor having an emitter connected to the first node, a collector connected to the power supply terminal, and a base connected to the first node.

14. A circuit according to claim 1, wherein said diode comprises:
a fourth p-channel MOS transistor having one of a drain and source connected to the first node, the other one of the drain and source connected to the power supply terminal, and a back gate connected to the first node, and a bias circuit configured to supply the potential of the first node to a gate of said fourth p-channel MOS transistor when the ground potential or the open terminal potential is supplied to the power supply terminal by said switch, and to supply the ground potential when the power supply voltage is supplied by said switch.

15. A circuit according to claim 14, wherein said bias circuit is an inverter having an input terminal connected to the power supply terminal, having a power supply terminal connected to the first node, and having an output connected to the gate of said fourth p-channel MOS transistor.

16. A circuit according to claim 1, further comprising:
a CMOS transmission gate in which a first n-channel MOS transistor is parallel-connected to said second p-channel MOS transistor and the second control signal is supplied to the gate of said first n-channel MOS transistor.

17. A transmission gate circuit according to claim 1, further comprising:
a first n-channel MOS transistor having first and second terminals respectively connected between the first and second terminals of the first p-channel MOS transistor and having a gate configured to receive the second control signal, said first n-channel MOS transistor being parallel-connected to said first p-channel MOS transistor;
a second n-channel MOS transistor having first and second terminals respectively connected between a source and a back gate of said first n-channel MOS transistor, and configured to receive the second control signal at a gate thereof for short-circuiting the source and back gate of the first n-channel MOS transistor when the power supply voltage is supplied to the power supply terminal and said first n-channel MOS transistor is turned conductive;
a fourth p-channel MOS transistor parallel-connected to said second n-channel MOS transistor and having a back gate connected to the back gate of said first n-channel MOS transistor, and having a gate configured to receive the first control signal, and
a third n-channel MOS transistor having a first terminal connected to the back gate of said first n-channel MOS transistor, having a second terminal and back gate connected to the ground potential, and having a gate configured to receive the first control signal to connect the back gate of said first n-channel MOS transistor to the ground potential when the power supply voltage is supplied to the power supply terminal and said first n-channel MOS transistor is turned non-conductive.

18. A circuit according to claim 1, wherein said switch has an open terminal potential as the ground potential, substantially equal to the ground potential.

19. A transmission gate circuit, comprising:
a switch configured to switch between supplying a power supply voltage and a ground potential to a power supply terminal of the transmission gate circuit;
a first p-channel MOS transistor having first and second terminals respectively connected between input and output terminals of the transmission gate circuit and having a gate configured to receive a first control signal;
a second p-channel MOS transistor having first and second terminals respectively connected to a source and back gate of said first p-channel MOS transistor, and configured to receive the first control signal at a gate thereof for short-circuiting the source and back gate of the first p-channel MOS transistor when the power supply voltage is supplied to the power supply terminal and said first p-channel MOS transistor is turned conductive; and a third p-channel MOS transistor configured to connect the power supply terminal via a first node and having one terminal connected to the back gate of said first p-channel MOS transistor, the other terminal and back gate connected to the first node, and a gate configured to receive a second control signal to connect the back gate of said first p-channel MOS transistor to the power supply terminal when the power supply voltage is supplied to the power supply terminal and said first p-channel MOS transistor is turned non-conductive;
a diode having a cathode connected to the first node and an anode connected to the power supply terminal;
a first control circuit connected to the power supply terminal, having at least one input terminal configured to receive a third control signal, and having a power supply terminal connected to one of 1) the power supply potential, 2) the ground potential and 3) the open terminal potential via said switch, and configured to supply an output as the second control signal to the gate of said third p-channel MOS transistor; and
a second control circuit having an input terminal connected to the output of said first control circuit and having a power supply terminal connected to the first node, and configured to supply an output as the first control signal to the gates of said first and second p-channel MOS transistors,
wherein when the ground potential or the open terminal potential is supplied to the power supply terminal by said switch, said third p-channel MOS transistor is turned conductive to set the back gate of said first p-channel MOS transistor, the first node, and the first control signal at the same potential, to supply the potential to the gates of said first and second p-channel MOS transistors, and to turn non-conductive said first and second p-channel MOS transistors.

20. A circuit according to claim 19, wherein:
when the power supply voltage is supplied to the power supply terminal by said switch, said first control circuit outputs a potential corresponding to one or a plurality of control signals as the second control signal to conductive/non-conductive-control said third p-channel MOS transistor,
when the power supply voltage is supplied to the power supply terminal by said switch, said second control circuit outputs a potential corresponding to the second control signal as the first control signal to conductive/non-conductive-control said first and second p-channel MOS transistors, and
when the ground potential or the open terminal potential is supplied to the power supply terminal by said switch, said third p-channel MOS transistor turns conductive to set the back gate of said first p-channel MOS transistor, the first node, and the first control signal at the same potential, the gates of said first and second p-channel MOS transistors are supplied with the potential, and said first and second p-channel MOS transistors are turned non-conductive.

21. A transmission gate circuit according to claim 19, further comprising:
a first n-channel MOS transistor having first and second terminals respectively connected between the first and second terminals of the first p-channel MOS transistor and having a gate configured to receive the second control signal;
said first n-channel MOS transistor being parallel-connected to said first p-channel MOS transistor;

a second n-channel MOS transistor having first and second terminals respectively connected between a source and a back gate of said first n-channel MOS transistor, and configured to receive the second control signal at a gate thereof for short-circuiting the source and back gate of the first n-channel MOS transistor when the power supply voltage is supplied to the power supply terminal and said first n-channel MOS transistor is turned conductive;

a fourth p-channel MOS transistor parallel-connected to said second n-channel MOS transistor and having a back gate connected to the back gate of said first MOS transistor, and having a gate configured to receive the first control signal; and a third n-channel MOS transistor having a first terminal connected to the back gate of said first n-channel MOS transistor, having a second terminal and back gate connected to the ground potential, and having a gate configured to receive the first control signal to connect the back gate of said first n-channel MOS transistor to the ground potential when the power supply voltage is supplied to the power supply terminal and said first n-channel MOS transistor is turned non-conductive.

22. A circuit according to claim 19, wherein said switch has an open terminal potential as the ground potential, substantially equal to the ground potential.

* * * * *